US010075025B2

(12) United States Patent
Ichikawa

(10) Patent No.: US 10,075,025 B2
(45) Date of Patent: Sep. 11, 2018

(54) POWER TRANSMISSION DEVICE, WIRELESS POWER FEEDING SYSTEM, AND CONTROL METHOD

(71) Applicant: Renesas Electronics Corporation, Koutou-ku, Tokyo (JP)

(72) Inventor: Katsuei Ichikawa, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 273 days.

(21) Appl. No.: 14/898,830

(22) PCT Filed: Jun. 19, 2013

(86) PCT No.: PCT/JP2013/066823
§ 371 (c)(1),
(2) Date: Dec. 16, 2015

(87) PCT Pub. No.: WO2014/203346
PCT Pub. Date: Dec. 24, 2014

(65) Prior Publication Data
US 2016/0141882 A1  May 19, 2016

(51) Int. Cl.
*H02J 5/00* (2016.01)
*H02J 7/02* (2016.01)
(Continued)

(52) U.S. Cl.
CPC ............. *H02J 50/60* (2016.02); *H02J 5/005* (2013.01); *H02J 7/025* (2013.01); *H02J 17/00* (2013.01);
(Continued)

(58) Field of Classification Search
CPC .. H02J 5/005; H02J 7/025; H02J 17/00; H02J 50/12; H02J 50/60; H02J 50/80; H04B 5/0037
(Continued)

(56) References Cited

U.S. PATENT DOCUMENTS 8,729,734 B2 * 5/2014 Cook .................. H01F 38/14
307/104
8,922,066 B2 * 12/2014 Kesler ................ B60L 11/1812
307/104
(Continued)

FOREIGN PATENT DOCUMENTS

JP   2008-236917 A   10/2008
JP   2009-213295 A    9/2009
(Continued)

OTHER PUBLICATIONS

Communication dated Oct. 6, 2016, from the Japanese Patent Office in counterpart application No. 2015-522414.
(Continued)

*Primary Examiner* — Levi Gannon
(74) *Attorney, Agent, or Firm* — Sughrue Mion, PLLC

(57) ABSTRACT

The present power transmission device performs a power transmission process for transmitting power in a wireless manner through electromagnetic field resonance coupling using a resonance circuit. In a case where a resonance frequency of the resonance circuit set to be the same as a frequency of a power transmission signal which is output as transmission power is deviated during transmission of the power, the present power transmission device detects a direction in which the resonance frequency is deviated and controls the power transmission process on the basis of a detection result thereof. Consequently, it is possible to determine not only whether or not a foreign substance is present in a power transmission region but also determines whether or not the foreign substance influences wireless power transmission with high accuracy, and thus reliability of the wireless power transmission system can be improved.

20 Claims, 15 Drawing Sheets

(51) Int. Cl.
 *H02J 50/60*    (2016.01)
 *H02J 50/80*    (2016.01)
 *H02J 17/00*    (2006.01)
 *H03H 7/38*    (2006.01)
 *H04B 5/00*    (2006.01)
 *H02J 50/12*    (2016.01)

(52) U.S. Cl.
 CPC .............. *H02J 50/12* (2016.02); *H02J 50/80* (2016.02); *H03H 7/38* (2013.01); *H04B 5/0037* (2013.01)

(58) Field of Classification Search
 USPC ........................................................ 307/104
 See application file for complete search history.

(56) References Cited

U.S. PATENT DOCUMENTS

| | | | | |
|---|---|---|---|---|
| 9,190,850 | B2* | 11/2015 | Onizuka | H02J 5/005 |
| 9,711,968 | B2* | 7/2017 | Kim | H02J 5/005 |
| 9,768,643 | B2* | 9/2017 | Kanno | H02J 50/90 |
| 9,793,762 | B2* | 10/2017 | Hirasaka | H02J 5/005 |
| 2010/0164295 | A1* | 7/2010 | Ichikawa | H02J 7/025 |
| | | | | 307/104 |
| 2011/0304216 | A1* | 12/2011 | Baarman | H02J 5/005 |
| | | | | 307/104 |
| 2012/0001493 | A1 | 1/2012 | Kudo et al. | |
| 2012/0038220 | A1* | 2/2012 | Kim | H02J 7/025 |
| | | | | 307/104 |
| 2012/0038317 | A1 | 2/2012 | Miyamoto et al. | |
| 2012/0175968 | A1* | 7/2012 | Katsunaga | B60L 11/182 |
| | | | | 307/104 |
| 2012/0280575 | A1* | 11/2012 | Kim | H02J 17/00 |
| | | | | 307/104 |
| 2013/0063085 | A1 | 3/2013 | Takada et al. | |
| 2014/0175897 | A1* | 6/2014 | Taguchi | H01M 10/46 |
| | | | | 307/104 |
| 2016/0226311 | A1* | 8/2016 | Kanno | H02J 50/12 |

FOREIGN PATENT DOCUMENTS

| | | |
|---|---|---|
| JP | 2010-284065 A | 12/2010 |
| JP | 2011-219007 A | 11/2011 |
| JP | 2011-244531 A | 12/2011 |
| JP | 2012-16171 A | 1/2012 |
| JP | 2012-44735 A | 3/2012 |
| JP | 2012-65477 A | 3/2012 |

OTHER PUBLICATIONS

International Search Report of PCT/JP2013/066823 dated Sep. 3, 2013 [PCT/ISA/210].

* cited by examiner

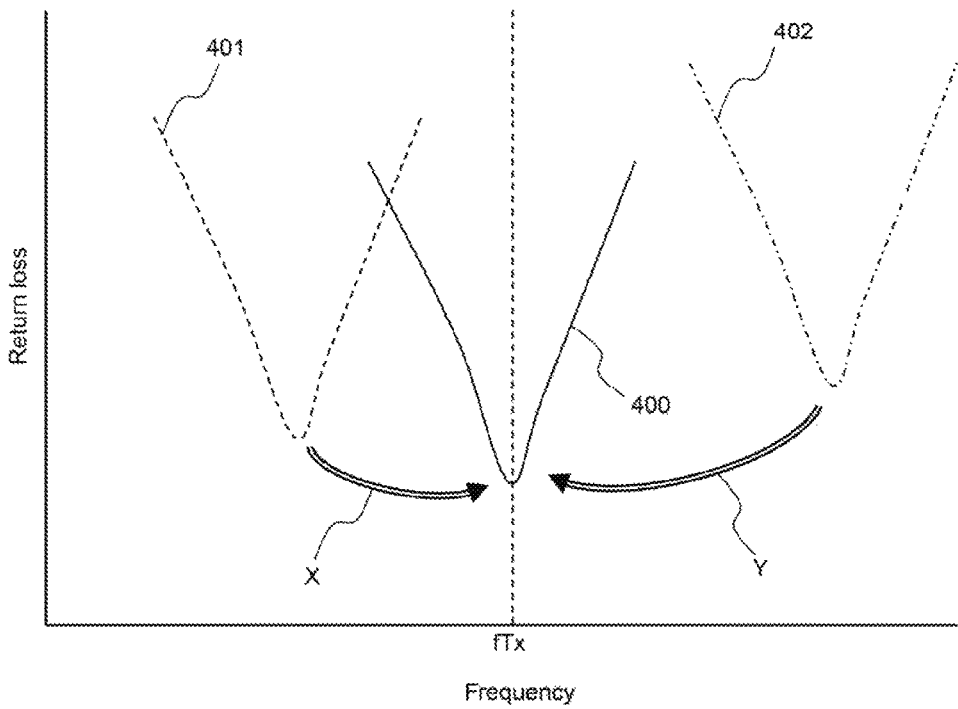

Fig.15

| DEVIATION DIRECTION OF RESONANCE FREQUENCY | EXTENT OF DEVIATION OF RESONANCE FREQUENCY | DETERMINATION RESULT | KIND OF FOREIGN SUBSTANCE |
|---|---|---|---|
| HIGH | CONSIDERABLE | NG | RELATIVELY LARGE METAL |
| HIGH | SLIGHT | OK | RELATIVELY SMALL METAL |
| LOW | CONSIDERABLE | NG | NON-METAL (HUMAN BODY OR THE LIKE) |
| LOW | SLIGHT | NG | NON-METAL (IC CARD OR THE LIKE) |

Fig.16

| DIFFERENCE BETWEEN AMOUNT OF TRANSMISSION POWER AND AMOUNT OF RECEPTION POWER | DEVIATION DIRECTION OF RESONANCE FREQUENCY | EXTENT OF DEVIATION OF RESONANCE FREQUENCY | DETERMINATION RESULT | KIND OF FOREIGN SUBSTANCE |
|---|---|---|---|---|
| GREAT | HIGH | CONSIDERABLE | NG | RELATIVELY LARGE METAL |
| GREAT | HIGH | SLIGHT | OK | RELATIVELY SMALL METAL |
| GREAT | LOW | CONSIDERABLE | NG | NON-METAL (HUMAN BODY OR THE LIKE) |
| GREAT | LOW | SLIGHT | NG | NON-METAL (IC CARD OR THE LIKE) |
| SMALL | - | - | OK | ABSENCE OF FOREIGN SUBSTANCE |

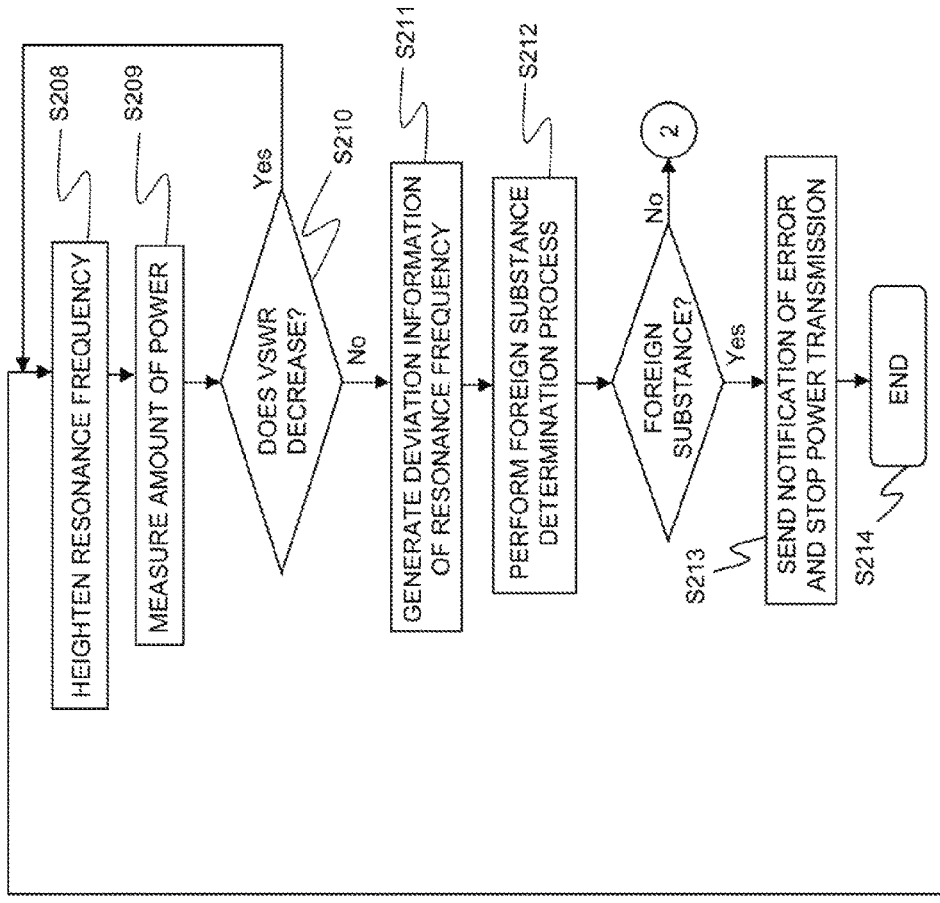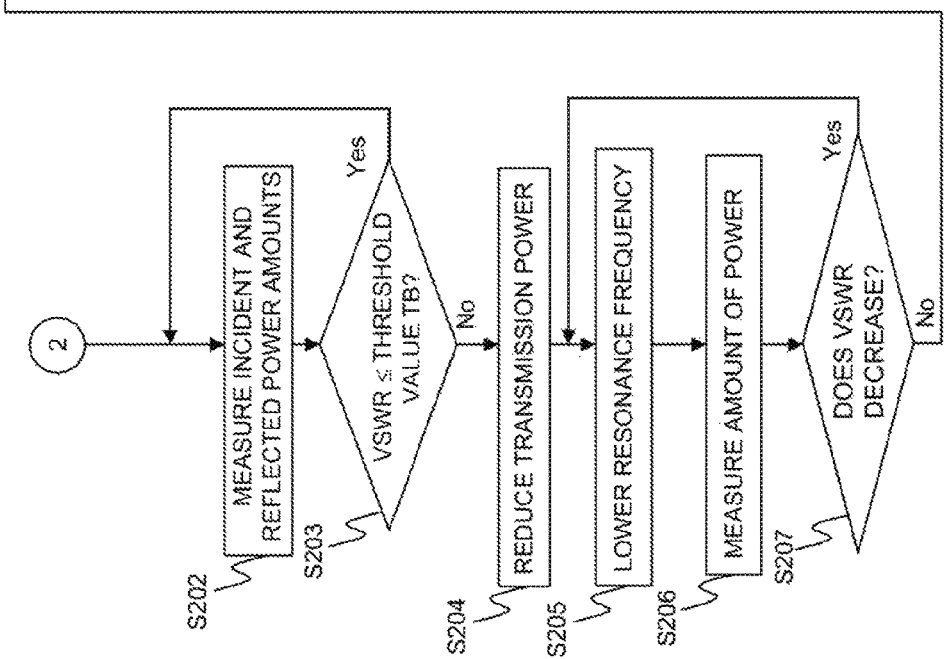
Fig.21

POWER TRANSMISSION DEVICE, WIRELESS POWER FEEDING SYSTEM, AND CONTROL METHOD

CROSS REFERENCE TO RELATED APPLICATIONS

This application is a National Stage of International Application No. PCT/JP2013/066823 filed Jun. 19, 2013, the contents of all of which is incorporated herein by reference in its entirety.

TECHNICAL FIELD

The invention relates to a power transmission device which transmits power in a wireless manner, a wireless power feeding system including the power transmission device, and a power transmission control method for the wireless power feeding system, and relates to a technique which is appropriate to be applied to a power transmission device and a wireless power feeding system using, for example, electromagnetic field resonance coupling (magnetic resonance).

BACKGROUND ART

A system (hereinafter, referred to as a "wireless power feeding system") using wireless power transmission in which power is supplied to an electric apparatus in a wireless manner without using a power cord or the like is being put into practical use. For example, an electromagnetic induction type wireless power feeding system using electromagnetic induction between antennae (coils) which are disposed to be separated from each other, or a magnetic resonance type wireless power feeding system using electromagnetic field resonance coupling is known. In addition, near field communication (NFC) is known as a standard regarding a wireless communication technique for transmitting information in a wireless manner, and IC cards or small portable terminal apparatuses conforming to the NFC standard also start to being widespread.

The magnetic resonance type wireless power feeding system is implemented by using a resonance circuit including coils and capacitors. The magnetic resonance type wireless power feeding system can have a longer transmission distance between a power transmission coil and a power reception coil than in an electromagnetic induction type of the related art by increasing a Q value of the coil, and has a feature of being strong to positional deviation of the power transmission coil and the power reception coil.

In addition, the magnetic resonance type wireless power feeding system has a feature of being hardly influenced by a foreign substance present between a power transmission side and a power reception side. However, since an amount of transmission power absorbed by a foreign substance is increased depending on the kind of foreign substance, power transmission efficiency is reduced, and there is also a concern that the foreign substance may be damaged due to heat generation caused by the power absorbed by the foreign substance.

The following PTLs 1 and 2 disclose techniques for detecting a foreign substance or an abnormality in a power feeding target in the magnetic resonance type wireless power feeding system.

For example, PTL 1 discloses a technique for detecting a foreign substance present between a power transmission side and a power reception side in a magnetic resonance type wireless power feeding system in which a power transmission coil is provided on a road, and a power reception coil is mounted on a vehicle, so that the vehicle is charged in a wireless manner. Specifically, according to the configuration disclosed in PTL 1, an impedance value is estimated by detecting a terminal voltage of a battery which is mounted in the vehicle and is charged on the basis of received power, and a notification of the presence of a foreign substance is sent and power feeding is also stopped in a case where a difference between the estimated value and an actually measured impedance value exceeds a threshold value.

In addition, PTL 2 discloses a technique for detecting an abnormality in a vehicle by detecting an increase in reflected power in a magnetic resonance type wireless power feeding system in which a power transmission coil is provided on a road, and a power reception coil is mounted on the vehicle, so that the vehicle is charged in a wireless manner. Specifically, according to the configuration disclosed in PTL 2, if a suspicious person gets in the vehicle which is being charged, impedance mismatching occurs due to a change in a vehicle height, thus reflected power increases, and a notification of an abnormality in the vehicle is sent when the increase in the reflected power is detected.

CITATION LIST

Patent Literature

[PTL 1] JP-A-2011-244531
[PTL 2] JP-A-2011-219007

DISCLOSURE OF THE INVENTION

Problems that the Invention is to Solve

As a result of the inventor having examined the magnetic resonance type wireless power feeding system of the related art, there are the following apparent problems.

The inventor of this application has found that, in the magnetic resonance type wireless power feeding system, even if a foreign substance is present between the power transmission side and the power reception side, whether or not the foreign substance is a foreign substance influencing wireless power transmission differs depending on a frequency (hereinafter, referred to as a "power transmission frequency") of a power transmission signal which is output as transmission power from the power transmission side.

For example, in a case where a foreign substance is a metal in wireless power transmission using a power transmission frequency of 100 kHz band which is used for electromagnetic cookers, transmission power is considerably absorbed by the metal, transmission efficiency is notably reduced, and thus there is a concern that an amount of heat generated from the metal may also be increased. In contrast, in a case where a foreign substance is an IC card or the like conforming to the NFC standard (frequency of 13.65 MHz), since an amount of absorbed power is small, transmission efficiency is not greatly reduced, and there is a low possibility of damage of the IC card due to heat generation. On the other hand, in wireless power transmission using a power transmission frequency of several MHz band close to a frequency of the NFC communication on which study progresses, in a case where a foreign substance is an IC card or the like conforming to the NFC standard, since transmission power is considerably absorbed by the IC card or the like, transmission efficiency is notably reduced, and thus there is a concern that the IC card or the like may be damaged. However, in a case where a foreign substance is a metal, since an amount of absorbed power is small, transmission efficiency is not greatly reduced, and an amount of heat generated from the metal is also small.

In the technique disclosed in PTL 1, a foreign substance is determined in a case where a difference between an estimated value and an actually measured value of impedance exceeds a threshold value, but whether or not the foreign substance is a foreign substance influencing wireless power transmission is not taken into consideration, and thus it is unlikely to be said that detection accuracy of a foreign substance is high. For example, in the wireless power feeding system disclosed in PTL 1, since there is a concern that a foreign substance is detected even if the foreign substance does not influence wireless power transmission, and then safety control such as stoppage of a power feeding operation works, it cannot be said that reliability of the wireless power feeding system is high. In addition, the technique disclosed in PTL 2 is used to detect only an increase in reflected power, and takes into no consideration improving detection accuracy of a foreign substance.

Means and the like for solving such problems will be described below, but other problems and novel features will become apparent from the description of the present specification and the accompanying drawings.

Means for Solving the Problems

Summary of the representative embodiments disclosed in this application will be described briefly as follows.

In other words, the present power transmission device performs a power transmission process for transmitting power in a wireless manner through electromagnetic field resonance coupling using a resonance circuit. In a case where a resonance frequency of the resonance circuit set to be the same as a frequency of a power transmission signal which is output as transmission power is deviated during transmission of the power, the power transmission device detects a direction in which the resonance frequency is deviated and controls the power transmission process on the basis of a detection result thereof.

Effects of the Invention

An effect achieved by the representative embodiments disclosed in this application will be described briefly as follows.

In other words, according to the present power transmission device, it is possible to increase reliability of a wireless power transmission system.

BRIEF DESCRIPTION OF THE DRAWINGS

FIG. 11 is a diagram illustrating a resonance frequency when impedance of the resonance frequency adjustment circuit 103 is changed.

FIG. 12 is a diagram illustrating an example of a foreign substance determination reference according to the first embodiment.

FIG. 15 is a diagram illustrating an example of a foreign substance determination reference according to a second embodiment.

FIG. 16 is a diagram illustrating an example of a foreign substance determination reference according to a third embodiment.

FIG. 21 is a flowchart illustrating an example of a flow of processes in a case where a foreign substance becomes close to a wireless power feeding system 9 according to the sixth embodiment.

DESCRIPTION OF EMBODIMENTS

1. Summary of the Embodiments

Figure 1:
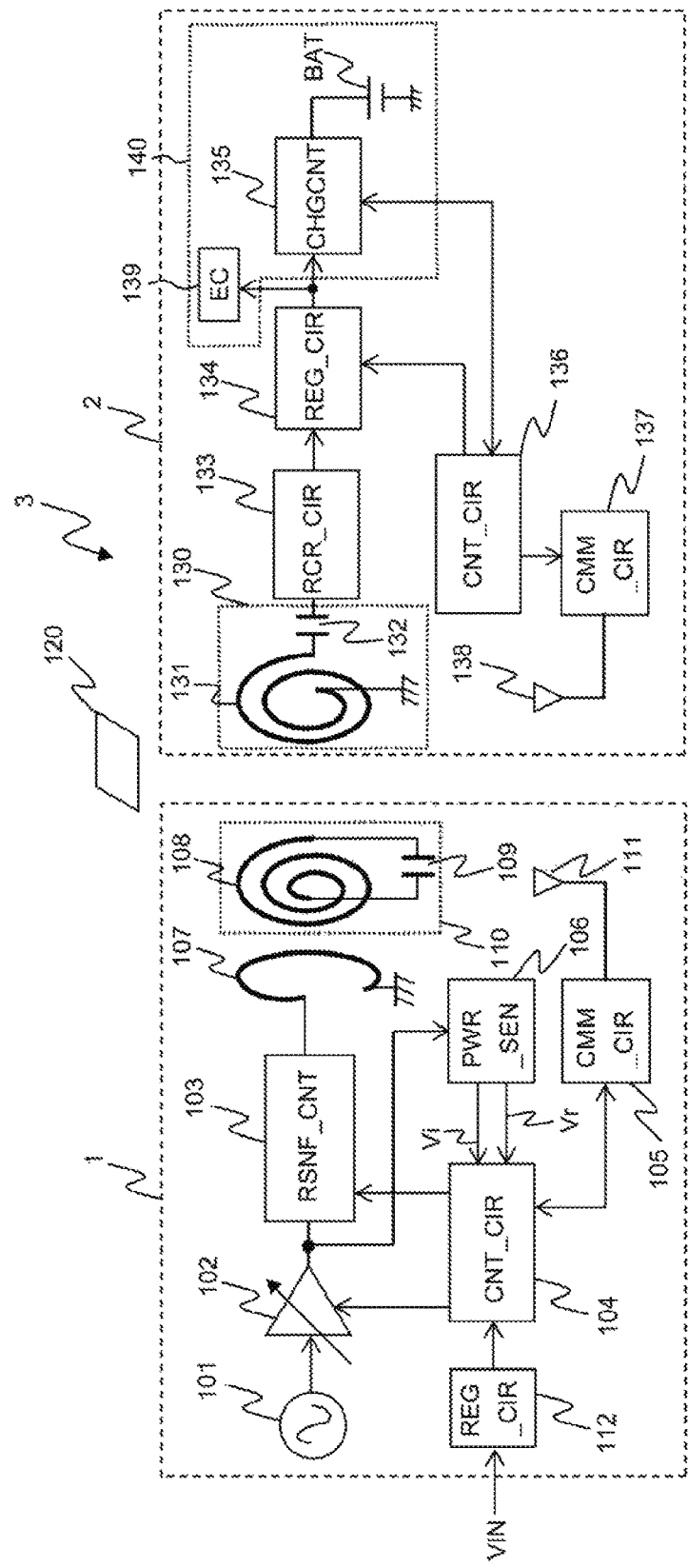
FIG. 1 is a diagram exemplifying a wireless power feeding system including a power transmission device according to a first embodiment.

First, summary of representative embodiments of the invention disclosed in the application will be described. Reference numerals in drawings in parentheses referred to in description of the summary of the representative embodiments just denote components included in the concept of the components to which the reference numerals are designated.

[1] (Power Transmission Device Controlling a Power Transmission Process on the Basis of a Direction in which a Resonance Frequency is Deviated)

A power transmission device (1, 4, 7) related to the representative embodiments performs a power transmission process for transmitting power in a wireless manner through electromagnetic field resonance coupling using a resonance circuit (110). In a case where a resonance frequency of the resonance circuit set to be the same as a frequency (fTx) of a power transmission signal which is output as transmission power is deviated during transmission of the power, the power transmission device detects a direction in which the resonance frequency is deviated and controls the power transmission process on the basis of a detection result thereof.

Consequently, it is possible to determine whether a foreign substance is a metallic foreign substance having a low dielectric constant or a nonmetallic foreign substance such as an IC card having a high dielectric constant on the basis of a direction in which the resonance frequency is deviated. In other words, according to the present power transmission device, not only the presence or absence of a foreign substance which is present in a power transmission region but also whether or not the foreign substance influences wireless power transmission can be determined with high accuracy. By applying the power transmission device to a wireless power transmission system, reliability of the wireless power transmission system is improved.

[2] (Control of Continuation and Stoppage of Power Transmission Based on Deviation Direction of Resonance Frequency)

In the power transmission device of the above item 1, whether or not transmission of the power is continued is controlled on the basis of the detection result.

Consequently, it is possible to perform control, for example, power transmission is stopped in a case where there is a foreign substance influencing wireless power transmission, and power transmission is continued in a case where there is a foreign substance not influencing wireless power transmission, and thus it is possible to increase reliability of power transmission control in the wireless power transmission system.

[3] (Control of Power Transmission Process Based on Deviation Direction and Extent of Deviation of Resonance Frequency)

The power transmission device according to the above item 2 detects the extent of deviation of the resonance frequency in addition to the direction in which the resonance frequency is deviated.

Consequently, it is possible to determine whether or not a foreign substance influences wireless power transmission with higher accuracy.

[4] (Control of Power Transmission Process Based on Difference Between Transmission Power and Reception Power and Deviation Information of Resonance Frequency)

The power transmission device according to any one of the above items 1 to 3 controls the power transmission process on the basis of a difference between an amount of reception power which is received by an external device as a power transmission target, and an amount of the transmission power which is transmitted in addition to the detection result.

Consequently, it is possible to determine whether or not a foreign substance influences wireless power transmission with higher accuracy.

[5] (Continuation of Power Transmission in Case where Resonance Frequency is High, and Stoppage of Power Transmission in Case where Resonance Frequency is Low)

In the power transmission device according to any one of the above items 2 to 4, transmission of the power is continued in a case where the resonance frequency is deviated in a direction of being heightened, and transmission of the power is stopped in a case where the resonance frequency is deviated in a direction of being lowered.

If a foreign substance is a metal, a resonance frequency tends to be deviated to a higher side, and if the foreign substance is an IC card or the like covered with nonmetallic plastic, the resonance frequency tends to be deviated to a lower side. According to the present power transmission device, since power transmission is stopped in a case where a nonmetallic foreign substance such as an IC card is present, for example, it is possible to prevent the IC card or the like conforming to an NFC standard from being damaged due to heat generation. In addition, since power feeding is stopped in a state in which a nonmetallic foreign substance such as an IC card which absorbs a large amount of transmission power is present, and power feeding is not stopped in a state in which a metallic foreign substance which absorbs a small amount of transmission power is present, it is possible to transmit power with high efficiency in a wireless power transmission system using a power transmission frequency of several MHz band close to a frequency of NFC communication.

[6] (Stoppage of Power Transmission in Case of Large-Sized Metal)

In the power transmission device according to the above items 3 or 4, in a case where the resonance frequency is deviated in a direction of being heightened, transmission of the power is stopped if the extent of deviation of the resonance frequency exceeds a predetermined threshold value, and transmission of the power is continued if the extent of deviation of the resonance frequency does not exceed the predetermined threshold value, and in a case where the resonance frequency is deviated in a direction of being lowered, transmission of the power is stopped.

Consequently, it is possible to prevent an IC card or the like from being damaged due to heat generation in the same manner as in the above item 5. In addition, in a case where a foreign substance is a metal, if a surface area of the metal is large, the extent of deviation of a resonance frequency tends to increase, and if the surface area thereof is small, the extent of deviation of the resonance frequency tends to decrease. According to the present power transmission device, even if a metallic foreign substance is present, power feeding is stopped in a case of a metal which has a large surface area and thus absorbs a relatively large amount of power, and power feeding is continued in a case of a metal which has a small surface area and thus absorbs a relatively small amount of power. Thus, it is possible to transmit power with higher efficiency in a wireless power transmission system using a power transmission frequency of several MHz band close to a frequency of the NFC communication.

[7] (Determination of Deviation Direction of Resonance Frequency Based on Change Direction of Reflected Power Amount)

The power transmission device according to any one of the above items 1 to 6, includes a power source unit (101, 102) that generates an AC signal corresponding to the transmission power, and a primary side resonance circuit (110) that includes a primary side resonance coil (108) and a resonance capacitor (109) as a power transmission antenna, and is supplied with power based on the AC signal generated by the power source unit. The power transmission device further includes a resonance frequency adjustment unit (103) that is provided between the power source unit and the primary side resonance circuit, and adjusts a resonance frequency of the primary side resonance circuit; a power amount detection unit (106) that detects the magnitude of a reflected power amount of an AC signal which is supplied to the primary side resonance circuit from the power source unit; and a control unit (104). The control unit changes the resonance frequency of the primary side resonance circuit by controlling the resonance frequency adjustment unit, and determines a direction in which the resonance frequency is deviated by determining a direction in which the reflected power amount detected by the power amount detection unit is changed.

Consequently, it is possible to easily determine a deviation direction of the resonance frequency.

[8] (Method of Determining Deviation Direction of Resonance Frequency; Determination Performed by Setting Resonance Frequency to be High)

In the power transmission device according to the above item 7, the control unit controls the resonance frequency adjustment unit so that the resonance frequency of the primary side resonance circuit is heightened, determines that the resonance frequency is deviated in a direction in which the resonance frequency becomes higher than the frequency of the power transmission signal in a case where the reflected power amount increases, and determines that the resonance frequency is deviated in a direction in which the resonance frequency becomes lower than the frequency of the power transmission signal in a case where the reflected power amount decreases.

Consequently, it is possible to determine a deviation direction of the resonance frequency simply and highly accurately.

[9] (Method of Determining Deviation Direction of Resonance Frequency; Determination Performed by Setting Resonance Frequency to be Low)

In the power transmission device according to the above item 7, the control unit controls the resonance frequency adjustment unit so that the resonance frequency of the primary side resonance circuit is lowered, determines that the resonance frequency is deviated in a direction in which the resonance frequency becomes lower than the frequency of the power transmission signal in a case where the reflected power amount increases, and determines that the resonance frequency is deviated in a direction in which the resonance frequency becomes higher than the frequency of the power transmission signal in a case where the reflected power amount decreases.

Consequently, it is possible to determine a deviation direction of the resonance frequency simply and highly accurately.

[10] (Method of Determining Deviation Direction of Resonance Frequency; Determination Performed by Setting Resonance Frequency to be Both High and Low)

In the power transmission device according to the above item 7, the control unit determines a deviation direction of the resonance frequency on the basis of a change direction of the reflected power amount when adjusting the resonance frequency adjustment unit so that the resonance frequency of the primary side resonance circuit is lowered, and a change direction of the reflected power amount when adjusting the resonance frequency adjustment unit so that the resonance frequency of the primary side resonance circuit is heightened.

Consequently, it is possible to determine a deviation direction of the resonance frequency with higher accuracy.

[11] (Determination of Change of Reflected Power Amount Based on Voltage Standing Wave Ratio VSWR)

In the power transmission device according to any one of the above items 7 to 10, the power amount detection unit generates a voltage (Vi) corresponding to an incident power amount of an AC signal which is supplied from the power source unit to the primary resonance circuit side and a voltage (Vr) corresponding to a reflected power amount of the AC signal. The control unit calculates a voltage standing wave ratio (VSWR) on the basis of the voltage corresponding to the incident power amount and the voltage corresponding to the reflected power amount, generated by the power amount detection unit, and determines a change direction of the reflected power amount on the basis of a calculation result thereof.

Consequently, it is possible to determine a change direction of the reflected power amount simply and highly accurately.

[12] (Search for State in which Reflected Power Amount Becomes Smallest while Changing Resonance Frequency)

In the power transmission device according to the above item 11, the control unit performs a calculation process of controlling the resonance frequency adjustment unit so as to change the resonance frequency of the primary side resonance circuit in one direction for each unit adjustment amount, thereby sequentially calculating values of the voltage standing wave ratio and also sequentially comparing calculated values before and after the resonance frequency is changed. The control unit performs the calculation process by reversing a direction in which the resonance frequency is changed if a calculated value after the resonance frequency is changed is greater than a calculated value before the resonance frequency is changed, and stops the calculation process if a calculated value after the resonance frequency is changed is smaller than a calculated value before the resonance frequency is changed.

Consequently, it becomes easier to search for and set a resonance frequency which causes the reflected power amount to become smallest.

[13] (Power Transmission Device which can Perform Data Communication)

The power transmission device according to any one of the above items 1 to 12, further includes a communication antenna (111); and a communication unit (105) that controls transmission and reception of data using the communication antenna.

[14] (Wireless Power Feeding System)

A wireless power feeding system (3, 6, 9) related to the representative embodiments includes the power transmission device (1) according to any one of the above items 1 to 13; and a power reception device (2, 5, 8) that receives power supplied from the power transmission device in a wireless manner through electromagnetic field resonance coupling using a resonance circuit (130, 141).

Consequently, it is possible to provide a wireless power feeding system with high reliability.

[15] (NFC Type Wireless Power Transmission System)

In the wireless power feeding system (6) according to the above item 14, the power transmission device and the power reception device can perform data communication conforming to an NFC standard. The power reception device can perform the data communication and power reception by using a single antenna (142).

Consequently, it is possible to provide an NFC type wireless power feeding system with high reliability.

[16] (Control Method for Wireless Power Feeding System; Control of Power Transmission Process Based on Deviation Direction of Resonance Frequency)

A control method related to the representative embodiments is a control method for controlling power transmission in a wireless power feeding system (3, 6, 9) which includes a power transmission device (1, 4, 7) and a power reception device (2, 5, 8) and performs transmission and reception of power through electromagnetic field resonance coupling using power transmission side and power reception side resonance circuits which are respectively provided in the power transmission device and the power reception device. The control method includes a first step (S102 to S116) of causing the power transmission device to set a resonance frequency of the power transmission side resonance circuit so that the resonance frequency is the same as a frequency (fTx) of a power transmission signal which is output as transmission power. The control method further includes a second step (S117) of causing the power transmission device to start transmission of the power after setting the resonance frequency in the first step. The control method further includes a third step (S201 to S213) of causing the power transmission device to detect a direction in which the resonance frequency is deviated in a case where the resonance frequency set in the first step is deviated during transmission of the power and to control a process related to transmission of the power on the basis of a detection result thereof.

Consequently, in a case where a foreign substance is present in a power transmission region of a wireless power feeding system, it is possible to determine whether a foreign substance is a metallic foreign substance having a low dielectric constant or a nonmetallic foreign substance such as an IC card having a high dielectric constant on the basis of a direction in which the resonance frequency is deviated. In other words, according to the present control method, not only the presence or absence of a foreign substance which is present in a power transmission region but also whether or not the foreign substance influences wireless power transmission can be determined with high accuracy. Consequently, reliability of the wireless power transmission system is improved.

[17] (Control Method; Control of Continuation and Stoppage of Power Transmission Based on Deviation Direction of Resonance Frequency)

In the control method according to the above item 16, the third step includes a fourth step (S205 to S211) of causing the power transmission device to measure a reflected power amount of an AC signal supplied to the resonance circuit while changing the resonance frequency of the power transmission side resonance circuit, thereby estimating a resonance frequency which causes the reflected power amount to be smallest, and to generate information regarding deviation of the resonance frequency, including a deviation direction of the resonance frequency on the basis of the estimated resonance frequency. The third step further includes a fifth step (S212) of causing the power transmission device to determine the presence or absence of a foreign substance influencing wireless power transmission on the basis of the information regarding deviation of the resonance frequency generated in the fourth step. The third step further includes a sixth step (S201) of causing the power transmission device to stop (S213) transmission of the power in a case where it is determined that there is a foreign substance influencing the wireless power transmission in the fifth step, and to continue transmission of the power in a case where there is no foreign substance influencing the wireless power transmission.

Consequently, it is possible to easily determine a deviation direction of the resonance frequency. In addition, since stoppage and continuation of power transmission are controlled depending on not only the presence or absence of a foreign substance but also whether or not the foreign substance influences wireless power transmission, it is possible to increase reliability of power transmission control in the wireless power transmission system.

[18] (Control Method; Control of Power Transmission Process Based on Deviation Direction and Extent of Deviation of Resonance Frequency)

In the fourth step of the control method according to the above item 17, the power transmission device generates the information regarding deviation, including the extent of deviation of the resonance frequency in addition to a deviation direction of the resonance frequency.

Consequently, it is possible to detect whether or not a foreign substance influences wireless power transmission with high accuracy.

[19] (Control Method; Control of Power Transmission Process Based on Difference Between Transmission Power and Reception Power and Deviation Information)

In the control method according to the above item 17 or 19, the third step includes a step (S201) of the power reception device to transmit information regarding an amount of reception power which is received to the power transmission device. In the fifth step, the power transmission device calculates a difference between the amount of reception power and an amount of transmission power which is transmitted from the power transmission device on the basis of the information regarding the reception power, transmitted from the power reception device, and determines the presence or absence of a foreign substance influencing wireless power transmission on the basis of the difference and the deviation information.

Consequently, it is possible to detect whether or not a foreign substance influences wireless power transmission with higher accuracy.

[20] (Determination of Continuation and Stoppage of Power Transmission Based on Deviation Direction of Resonance Frequency)

In the fifth step of the control method according to any one of the above items 17 to 19, the power transmission device determines that there is a foreign substance which does not influence wireless power transmission in a case where the resonance frequency is deviated in a direction of being heightened, and determines that there is a foreign substance which influences wireless power transmission in a case where the resonance frequency is deviated in a direction of being lowered.

Consequently, since power feeding is stopped in a state in which a nonmetallic foreign substance such as an IC card which absorbs a large amount of transmission power is present, and power feeding is not stopped in a state in which a metallic foreign substance which absorbs a small amount of transmission power is present, it is possible to transmit power with high efficiency in a wireless power transmission system using a power transmission frequency of several MHz band close to a frequency of NFC communication. In addition, for example, it is possible to prevent an IC card or the like conforming to an NFC standard from being damaged due to heat generation.

[21] (Control Method: Stoppage of Power Transmission in Case of Large-Sized Metal)

In the fifth step of the control method according to the above item 17, in a case where the resonance frequency is deviated in a direction of being heightened, the power transmission device determines that there is a foreign substance which influences wireless power transmission if the extent of deviation of the resonance frequency exceeds a predetermined threshold value, and determines that there is a foreign substance which does not influence wireless power transmission if the extent of deviation of the resonance frequency does not exceed the predetermined threshold value. In addition, in a case where the resonance frequency is deviated in a direction of being lowered, the power transmission device determines that there is a foreign substance which influences wireless power transmission.

Consequently, it is possible to prevent an IC card or the like from being damaged due to heat generation in the same manner as in the above item 20. In addition, even if a metallic foreign substance is present, power feeding is stopped in a case of a metal which has a large surface area and thus absorbs a relatively large amount of power, and power feeding is continued in a case of a metal which has a small surface area and thus absorbs a relatively small amount of power. Thus, it is possible to transmit power with higher efficiency in the wireless power transmission system.

[22] (Control Method; Determination of Deviation Direction of Resonance Frequency Based on Measured Value of Voltage Standing Wave Ratio)

In the fourth step of the control method according to any one of the above items 17 to 21, the power transmission device measures an incident power amount of an AC signal supplied to the power transmission side resonance circuit and a reflected power amount of the AC signal, and measures the reflected power amount by using a value of a voltage standing wave ratio which is calculated on the basis of the measurement result.

Consequently, it is possible to determine a deviation direction of the resonance frequency simply and highly accurately.

[23] (Control Method; Measurement of Voltage Standing Wave Ratio Through Change of Resonance Frequency and Calculation of Deviation Direction)

In the control method according to the above item 22, the fourth step includes a seventh step (S205 to S207) causing the power transmission device to repeatedly perform a calculation process of calculating the voltage standing wave ratios before and after the resonance frequency is changed by changing the resonance frequency of the resonance circuit of the power transmission device by a predetermined amount and of comparing the voltage standing wave ratios before and after the resonance frequency is changed, until a value of the voltage standing wave ratio after the resonance frequency is changed is greater than a value of the voltage standing wave ratio before the resonance frequency is changed. The fourth step further includes an eighth step (S208 to S210) of causing the power transmission device to perform the calculation process by reversing a direction in which the resonance frequency is changed if the value of the voltage standing wave ratio after the resonance frequency is changed is greater than the value of the voltage standing wave ratio before the resonance frequency is changed in the calculation process in the seventh step, and also to repeatedly perform the calculation process until a value of the voltage standing wave ratio after the resonance frequency is changed is greater than a value of the voltage standing wave ratio before the resonance frequency is changed. The fourth step further includes a ninth step (S211) of causing the power transmission device to estimate a resonance frequency which causes a value of the voltage standing wave ratio to be smallest on the basis of results of the calculation processes in the seventh and eighth steps, and to generate deviation information of the resonance frequency on the basis of an estimated value thereof.

Consequently, it is possible to easily determine a deviation direction of the resonance frequency. In addition, it is possible to easily calculate the extent of deviation of the resonance frequency.

[24] (Control Method; Power Transmission in Small Amount of Power, and Power Transmission in Normal Amount of Power after Resonance Frequency is Optimized)

In the control method according to the above item 23, the first step includes a tenth step (S105) of causing the power transmission device to transmit power in a first amount of power. The first step further includes an eleventh step (S110 to S112) of causing the power transmission device to repeatedly perform a calculation process of calculating the voltage standing wave ratios before and after the resonance frequency is changed by changing the resonance frequency of the resonance circuit of the power transmission device by a predetermined amount and of comparing the voltage standing wave ratios before and after the resonance frequency is changed, until a value of the voltage standing wave ratio after the resonance frequency is changed is greater than a value of the voltage standing wave ratio before the resonance frequency is changed. The first step further includes a twelfth step (S113 to S115) of causing the power transmission device to perform the calculation process by reversing a direction in which the resonance frequency is changed if the value of the voltage standing wave ratio after the resonance frequency is changed is greater than the value of the voltage standing wave ratio before the resonance frequency is changed in the calculation process in the eleventh step, and also to repeatedly perform the calculation process until a value of the voltage standing wave ratio after the resonance frequency is changed is greater than a value of the voltage standing wave ratio before the resonance frequency is changed. The first step further includes a thirteenth step (S116) of setting a resonance frequency which causes a value of the voltage standing wave ratio to be smallest in the power transmission side resonance circuit if a value of the voltage standing wave ratio after the resonance frequency is changed is greater than a value of the voltage standing wave ratio before the resonance frequency is changed in the calculation process in the twelfth step. In the second step, the power transmission device starts power transmission in an amount of power larger than the first amount of power.

Consequently, it becomes easier to search for a resonance frequency which causes the reflected power amount to become smallest and to set the resonance frequency in the power transmission side resonance circuit. In addition, since power transmission is first started in a small amount of power and then power transmission is started in an increasing amount of power, even in a case where a foreign substance is already present at the time of starting of the power transmission, an influence on the foreign substance can be reduced. Therefore, it is possible to increase reliability of power transmission control in the wireless power transmission system.

[25] (Control Method; Authentication of Power Transmission Target)

In the control method according to the above item 24, the first step further includes a step (S104) of performing authentication on the power reception device in relation to whether or not the power reception device is a power transmission target before the tenth step. The tenth step is executed in a case where the power reception device is authenticated as a power transmission target.

Consequently, it is possible to further increase reliability of power transmission control in the wireless power transmission system.

[26] (Control Method; Starting of Transmission after Receiving Notification of Power Reception from Power Reception Device)

In the control method according to the above item 24, the first step includes a step (S122) of transmitting a notification indicating that power has been received to the power transmission device in a case where the power reception device receives the power transmitted in the tenth step. The first step further includes a step (S124) of performing authentication on the power reception device in relation to whether or not the power reception device is a power transmission target before the tenth step in a case where the power transmission device receives the notification indicating that the power has been received. The eleventh step is executed in a case where the power reception device is authenticated as a power transmission target.

Consequently, it is possible to prevent power transmission from being started in a situation in which wireless communication (data communication) can be performed between the power transmission device and the power reception device but sufficient power cannot be transmitted and received, and thus to further increase reliability of the power transmission control in the wireless power transmission system.

[27] (Power Transmission Device; Configuration of Resonance Frequency Adjustment Unit Whose Impedance can be Adjusted)

In the power transmission device according to any one of the above items 7 to 13, the resonance frequency adjustment unit includes an inductor (202) that is connected between the power source unit and the primary side resonance circuit; a first capacitor (201) that is connected between one end of the inductor and a ground node; and a second capacitor (203) that is connected between the other end of the inductor and the ground node. Capacitance values of the first capacitor and the second capacitor can be adjusted.

Consequently, it is possible to easily adjust impedance of the resonance frequency adjustment unit.

[28] (Power Transmission Device; Capacitive Element Constituted of Variable Capacitance Diode)

In the power transmission device according to the above item 27, the first capacitor and the second capacitor are configured to respectively include variable capacitance diodes (503, 504). The variable capacitance diodes can be controlled on the basis of a voltage supplied from the control unit.

Consequently, it is possible to easily change capacitance values of the first capacitor and the second capacitor.

[29] (Power Transmission Device; Capacitive Element Configured to Include Capacitor and Switch Transistor)

In the power transmission device according to the above item 27, each of the first capacitor and the second capacitor is configured to include a plurality of (n, m) capacitance circuits (601) in which a capacitive element (603) and a switch circuit (SW) are connected in series to each other.

Consequently, it is possible to easily change capacitance values of the first capacitor and the second capacitor.

[30] (Power Transmission Device; Switch Circuit Having Configuration for Preventing Current Leakage)

In the power transmission device according to the above item 29, the switch circuit includes two field effect transistors (604, 605) which are connected in series to each other. Mutual source electrodes and backgate electrodes of the two field effect transistors are respectively connected to each other.

Consequently, it is possible to prevent currents from leaking via parasitic diodes which are present between the backgate electrodes and the drain electrodes of the field effect transistors.

[31] (Wireless Power Feeding System; Q Value which is Smaller on Power Reception Side than on Power Transmission Side)

In the wireless power feeding system according to the above item 14 or 15, the resonance circuit (130) of the power reception device has a Q value smaller than that of the resonance circuit (110) of the power transmission device.

Consequently, since the extent of deviation of the resonance frequency in the power reception device is smaller than the extent of deviation of the resonance frequency in the power transmission device, it is possible to more easily adjust the resonance frequency than in the power transmission device.

[32] (Power Transmission Device which Determines the Kind of Foreign Substance Based on Deviation of Resonance Frequency)

A power transmission device (1) according to another embodiment which is different from the embodiment of the above items 1 to 13 performs transmission of power in a wireless manner through electromagnetic field resonance coupling using a resonance circuit (110). In a case where a resonance frequency of the resonance circuit which is set to correspond to a frequency (fTx) of a power transmission signal for transmitting the power is deviated during transmission of the power, the power transmission device detects a direction in which the resonance frequency is deviated and determines the kind of foreign substance which is present in a power transmission region on the basis of a detection result thereof.

Consequently, since not only the presence or absence of a foreign substance present in the power transmission region but also the kind of foreign substance can be determined, it is possible to increase foreign substance detection accuracy and thus to contribute to improvement of reliability of the wireless power feeding system.

2. Further Detailed Description of the Embodiments

The embodiments will be described more in detail. The same reference numerals are given to elements having the same functions throughout the drawings for explaining the embodiments of the invention, and repeated description thereof will be omitted.

First Embodiment

Summary of Wireless Power Feeding System

FIG. 1 exemplifies a wireless power feeding system including a power transmission device according to a first embodiment. A wireless power feeding system 3 illustrated in FIG. 1 includes a power transmission device 1 and a power reception device 2. In the wireless power feeding system 3, power can be supplied from the power transmission device 1 to the power reception device 2 in a wireless manner. Although not particularly limited, the wireless power feeding system 3 can perform wireless power transmission based on a magnetic resonance method using electromagnetic field resonance coupling. In the wireless power transmission, a frequency (power transmission frequency) of a power transmission signal which is output as transmission power is a frequency of several MHz band, for example. In addition, in the wireless power feeding system 3, data can be transmitted and received between the power transmission device 1 and the power reception device 2 via near field communication. The near field communication is wireless communication using a frequency of several GHz band, for example.

<Configuration of Power Transmission Device 1>

The power transmission device 1 is configured to include, for example, an oscillator 101, a power transmission amplifier 102, a resonance frequency adjustment circuit (RSN-F_CNT) 103, a power source circuit (REG_CIR) 112, a control circuit (CNT_CIR) 104, a communication unit (CM-M_CIR) 105, a power amount detection unit (PWR_SEN) 106, a power feeding coil 107, a resonance coil 108, a resonance capacitor 109, and a communication antenna 111.

The oscillator 101 generates an AC signal with a frequency corresponding to a power transmission signal for transmitting power which is transmitted from the power transmission device 1. Although not particularly limited, the frequency of the AC signal output from the oscillator 101 is constant, and is the same as a frequency (power transmission frequency) fTx of the power transmission signal. The power transmission amplifier 102 amplifies the AC signal output from the oscillator 101 so as to generate a driving signal corresponding to the magnitude of power to be transmitted. The power transmission amplifier 102 is a variable amplifier whose amplification factor is varied. The power transmission amplifier 102 operates by using a voltage generated by, for example, the power source circuit 112 as a power source, and varies an amplification factor thereof by adjusting a bias voltage or a bias current which is supplied to the power transmission amplifier 102. The power source circuit 112 generates a plurality of voltages which are used as an operation power source of the respective functional units of the power transmission device 1 on the basis of an input voltage VIN which is supplied from, for example, a power source adaptor or a universal serial bus (USB). For example, as described above, a voltage which is used as an operation power source of the power transmission amplifier 102 or a voltage which is used as an operation power source of the control circuit 104 is generated.

The driving signal output from the power transmission amplifier 102 is supplied to the power feeding coil 107 via the resonance frequency adjustment circuit 103. The power feeding coil 107 and the resonance coil 108 are magnetically coupled to each other, and thus AC power related to the driving signal supplied to the power feeding coil 107 is supplied to the resonance coil 108 through electromagnetic induction. The resonance coil 108 and the resonance capacitor 109 constitute a primary side resonance circuit 110. The resonance circuit 110 is, for example, a parallel resonance circuit in which the resonance coil 108 and the resonance capacitor 109 are connected in parallel to each other. A magnetic field is generated by resonance in the resonance circuit 110, and thus power is transmitted to the power transmission device 1.

In order to generate a strong magnetic field in the resonance coil 108 and the resonance capacitor 109, it is necessary to increase a Q value of the resonance coil 108. Here, a Q value of a coil will be described. The Q value of the coil is also called sharpness, selectivity, or the like, and when inductance of the coil is indicated by L, a coil resistance component is indicated by r, and an angular velocity of the power transmission frequency fTx is indicated by ω, the Q value is obtained from the following equation.

$$Q = \omega L / r \qquad \text{[Equation 1]}$$

As can be seen from Equation (1), the coil resistance component r is reduced to increase the Q value, and thus a coil with a low loss is preferably used. For this reason, as a wire material used for the coil, preferably, a copper wire material with a low resistance component is used as a wire material for a coil, and a wire diameter is also increased, thereby achieving a low loss.

The resonance frequency adjustment circuit 103 is provided between the power transmission amplifier 102 and the resonance circuit 110. Specifically, the resonance frequency adjustment circuit 103 is connected between the power feeding coil 107 and the power transmission amplifier 102, and causes impedance matching between the resonance circuit 110 and an internal circuit connected thereto and also adjusts a resonance frequency of the resonance circuit 110. As a specific internal configuration of the resonance frequency adjustment circuit 103 will be described later, impedance of the resonance frequency adjustment circuit 103 can be adjusted, and a resonance frequency of the resonance circuit 110 is adjusted by adjusting the impedance thereof. For example, during a normal power feeding operation in which the power reception device 2 receives power transmitted from the power transmission device 1 and charges a battery BAT, impedance matching occurs between the resonance circuit 110 and the internal circuit, and a resonance frequency of the resonance circuit 110 is also adjusted to be the same as the power transmission frequency. Consequently, power is efficiently fed to the resonance circuit 110 from the power feeding coil 107 through magnetic coupling, and the resonance coil 108 efficiently generates a magnetic field so as to be strongly coupled to a resonance circuit 130 of the power reception device 2.

The power amount detection unit 106 generates a voltage Vi corresponding to an incident power amount of the driving signal which is supplied from the power transmission amplifier 102 to the resonance circuit 110 side, and a voltage Vr corresponding to a reflected power amount of the driving signal. The communication unit 105 performs wireless communication with the power reception device 2 via the communication antenna 111. For example, exchange of authentication data for authenticating whether or not the power reception device 2 is a power transmission target of the power transmission device 1, exchange of a power reception notification indicating whether or not power transmitted from the power transmission device 1 is received by the power reception device 2, or the like is performed by using the wireless communication. In addition, exchange of data with the power reception device 2, which is required to control wireless power transmission is realized by using the wireless communication in the communication unit 105.

The control circuit 104 is configured to include a program processing unit which performs data processing according to a program stored in a memory or the like. The control circuit 104 is, for example, a micro-controller, and is configured to include a semiconductor integrated circuit formed on a semiconductor substrate such as single monocrystalline silicon by using, for example, a well-known CMOS integrated circuit manufacturing technique. The control circuit 104 comprehensively controls the power transmission device 1. For example, the control circuit controls wireless communication using the communication antenna 111 and execution and stoppage of wireless power transmission using the resonance coil 108, and performs various data processes in the wireless communication and various data processes related to wireless power transmission data. For example, in case that the wireless communication is performed, the control circuit 104 performs a modulation process and a demodulation process of a signal related to the wireless communication. In addition, in case that the wireless power transmission is performed, the control circuit 104 adjusts an amount of power to be transmitted by controlling an amplification factor of the power transmission amplifier 102 and also adjusts a resonance frequency of the resonance circuit 110 by controlling the resonance frequency adjustment circuit 103. Further, during the wireless power feeding, the control circuit 104 incorporates the voltage Vi and the voltage Vr generated by the power amount detection unit 106 so as to calculate a voltage standing wave ratio VSWR, and performs various controls on the basis of a calculation result thereof. Still further, details of control based on the voltage standing wave ratio VSWR in the control circuit 104 will be described later.

<Configuration of Power Reception Device 2>

The power reception device 2 is, for example, a small-sized portable device such as a portable terminal, and can perform transmission and reception of data using wireless communication and can charge the battery BAT by using wireless power feeding. The power reception device 2 is configured to include, for example, a power reception coil 131, a resonance capacitor 132, a rectifying circuit (RCR_CIR) 133, a power source circuit (REG_CIR) 134, a charging control circuit (CHGCNT) 135, a control circuit (CNT_CIR) 136, a communication unit (CMM_CIR) 137, a communication antenna 138, an internal circuit (EC) 139, and the battery BAT.

The power reception coil 131 and the resonance capacitor 132 constitute the secondary side resonance circuit 130, and causes an electromagnetic force (AC signal) depending on the resonance action of a magnetic field generated by the primary side resonance circuit 110 of the power transmission device 1. A resonance frequency of the resonance circuit 130 is adjusted to be the same as the power transmission frequency fTx, and thus the magnetic field from the power transmission device 1 can be efficiently received.

The rectifying circuit 133 converts the AC signal received by the resonance circuit 130 into a DC voltage signal. The power source circuit 134 converts the DC voltage converted by the rectifying circuit 133, into a predetermined voltage with a desired magnitude. The power source circuit 134 is a DC/DC converter, and is configured to include, for example, a step-down switching regulator or series regulator (low drop out: LDO).

The voltage generated by the power source circuit 134 is supplied as a power source voltage of each functional unit of the power reception device 2. For example, in FIG. 1, the internal circuit 139, the charging control circuit 135, and the battery BAT are exemplified as load circuits 140 connected to an output terminal of the power source circuit 134.

The internal circuit 139 is an electronic circuit for realizing an inherent function (for example, a function expected for a portable terminal if the power reception device 2 is the portable terminal) of the power reception device 2. The battery BAT is a secondary battery which can be charged on the basis of the DC voltage generated by the power source circuit 134. Although not particularly limited, the battery is, for example, a single cell battery (4.0 V to 4.2 V), and is, for example, a lithium ion battery. The charging control circuit 135 controls charging of the battery BAT based on the DC voltage generated by the power source circuit 134. For example, the charging control circuit 135 monitors a charging current of the battery BAT or a terminal voltage of the battery BAT, so as to detect states (a full-charge capacity, a residual quantity, a charging state, and the like) of the battery BAT, thereby controlling execution or stoppage of charging. Although not particularly limited, the charging control circuit 135 is, for example, a micro-controller which is constituted of a semiconductor integrated circuit formed on a semiconductor substrate such as single monocrystalline silicon by using a well-known CMOS integrated circuit manufacturing technique.

The communication unit 137 performs wireless communication with the power transmission device 1 via the communication antenna 138. Specifically, transmission and reception of data using the wireless communication can be performed between the communication unit 137 of the power reception device 2 and the communication unit 105 of the power transmission device 1 via the communication antennae 111 and 138.

The control circuit 136 comprehensively controls the power reception device 2. For example, the control circuit controls execution and stoppage of wireless communication using the communication antenna 138 or performs various data processes (for example, a modulation process or a demodulation process on a received signal) in wireless communication, and also performs an operation control (enable control) of the power source circuit 134 or controls the charging control circuit 135 to perform execution and stoppage of charging control of the battery BAT.

The above-described resonance circuit 130 is connected in series to the following rectifying circuit 133 which has input impedance of about 20Ω to 30Ω, and thus has a Q value smaller than that of the resonance circuit 110 of the power transmission device 1. Consequently, even in a case where a resonance frequency of the resonance circuit 130 of the power reception device 2 is deviated due to entry of foreign substances, the extent of deviation is smaller than the extent of deviation of a resonance frequency of the power transmission device, and thus the resonance frequency can be more easily adjusted than that of the power transmission device 1. In addition, as illustrated in FIG. 1, since the resonance circuit 130 is a serial resonance circuit in which the power reception coil 131 and the resonance capacitor 132 are connected in series to each other, impedance matching with a circuit of the following stage can be easily performed, and thus there is little necessity to separately provide a matching circuit in the following stage of the resonance circuit 130. Even if the matching circuit is provided, the matching circuit can be implemented by using a simple circuit configuration. This contributes to miniaturization of the power reception device 2.

<Configuration of Resonance Frequency Adjustment Circuit 103>

The resonance frequency adjustment circuit 103 of the power transmission device 1 will be described in detail.

As described above, a resonance frequency of the resonance circuit 110 is adjusted by changing impedance of the resonance frequency adjustment circuit 103. As the resonance frequency adjustment circuit 103, for example, an antenna coupler may be used.

Figure 2:
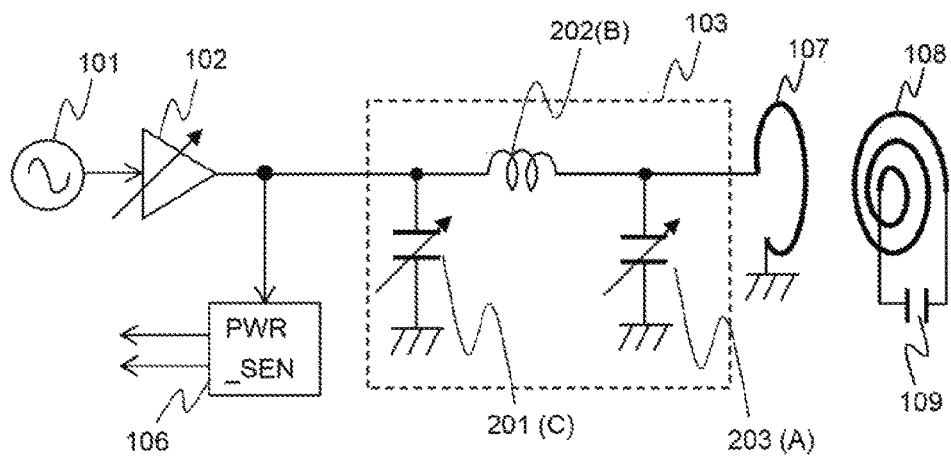
FIG. 2 is a diagram exemplifying an internal configuration of a resonance frequency adjustment circuit 103.

FIG. 2 exemplifies an internal configuration of the resonance frequency adjustment circuit 103. As illustrated in FIG. 2, the resonance frequency adjustment circuit 103 includes an inductor 202 which is connected between an output node of the power transmission amplifier 102 and the power feeding coil 107, a variable capacitor 201 which is connected between a terminal of the inductor 202 on the power transmission amplifier 102 side and a ground node, and a variable capacitor 203 which is connected between a terminal of the inductor 202 on the power feeding coil 107 side and the ground node. Capacitance values of the variable capacitor 201 and the variable capacitor 203 can be adjusted. Consequently, impedance of the resonance frequency adjustment circuit 103 can be easily changed, and thus a resonance frequency can be easily adjusted. For example, in a case of the resonance frequency adjustment circuit 103 illustrated in FIG. 2, if the capacitance values of the variable capacitors 201 and 203 are increased, the resonance frequency is deviated so as to be lowered, and if the capacitance values thereof are reduced, the resonance frequency is deviated so as to be heightened.

Figure 3:
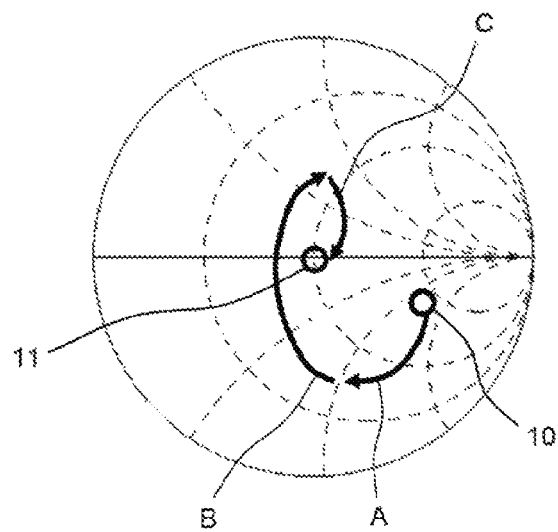
FIG. 3 is a Smith chart for explaining impedance matching performed by the resonance frequency adjustment circuit 103.

FIG. 3 is a Smith chart for explaining impedance matching performed by the resonance frequency adjustment circuit 103. FIG. 3 illustrates a state in which impedance characteristics of the power feeding coil 107 are changed as a result of adjusting impedance of the resonance frequency adjustment circuit 103.

As illustrated in FIG. 3, a case is assumed in which impedance 10 of the resonance circuit 110 (power feeding coil 107) side viewed from the power transmission amplifier 102 has highly capacitive characteristics when the resonance frequency adjustment circuit 103 is not provided. In this case, if the resonance frequency adjustment circuit 103 is provided at the above-described position, the impedance is moved as follows. First, the impedance is moved in a direction indicated by the reference sign A by the variable capacitor 203. Next, the impedance is moved in a direction indicated by the reference sign B by the inductor 202. In addition, the impedance is moved in a direction indicated by the reference sign C by the variable capacitor 201.

Here, an amount of change of the impedance indicated by the reference sign A is determined by the capacitance value of the variable capacitor 203, and an amount of change of the impedance indicated by the reference sign B is determined by the capacitance value of the variable capacitor 201. Thus, impedance matching can be realized by adjusting the capacitance values of the variable capacitors 201 and 203 so that the impedance of the resonance circuit 110 side viewed from the power transmission amplifier 102 is moved to a position (the center on the Smith chart: 50Ω) indicated by the reference numeral 11.

Figure 4:
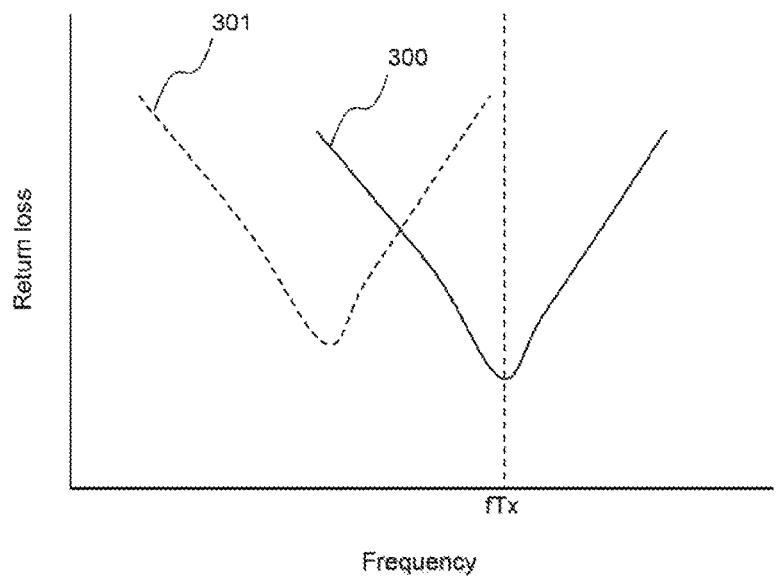
FIG. 4 is a diagram illustrating a relationship between a resonance frequency and a reflected power amount of a signal.

FIG. 4 is a diagram illustrating a relationship between a resonance frequency and a reflected power amount of a signal. In FIG. 4, a transverse axis expresses a frequency, and a longitudinal axis expresses a reflected power amount (return loss) of a signal. The reference numeral 301 indicates a reflection characteristic when impedance is located at the position indicated by the reference numeral 10 of FIG. 3, and the reference numeral 300 indicates a reflection characteristic when impedance is located at the position indicated by the reference numeral 11 of FIG. 3. In addition, in FIG. 4, fTx indicates a power transmission frequency. In the respective characteristics 300 and 301, a frequency at the smallest reflected power amount is a resonance frequency of the resonance circuit 110.

As described above, in a case where the resonance frequency adjustment circuit 103 is not provided, impedance of the resonance circuit 110 side viewed from the power transmission amplifier 102 is located at the position indicated by the reference numeral 10 of FIG. 3, and thus an impedance mismatching state occurs. In this case, a resonance frequency of the resonance circuit 110 is deviated to a region which is lower than the power transmission frequency fTx as indicated by the characteristic 301. For this reason, if an AC signal with the power transmission frequency fTx is output from the power transmission amplifier 102, a reflected power amount thereof increases, and thus power cannot be transmitted with high accuracy. In contrast, in a case where impedance is moved to the position indicated by the reference numeral 11 of FIG. 3 by the resonance frequency adjustment circuit 103 so that impedance matching occurs, a resonance frequency matches the power transmission frequency fTx and thus the reflected power amount becomes smallest as indicated by the characteristic 300.

As described above, by adjusting impedance of the resonance frequency adjustment circuit 103, impedance matching can be realized, and a resonance frequency of the resonance circuit 110 can be made to match the power transmission frequency fTx, so that a reflected power amount can be reduced and power can be transmitted with high accuracy.

Figure 5:
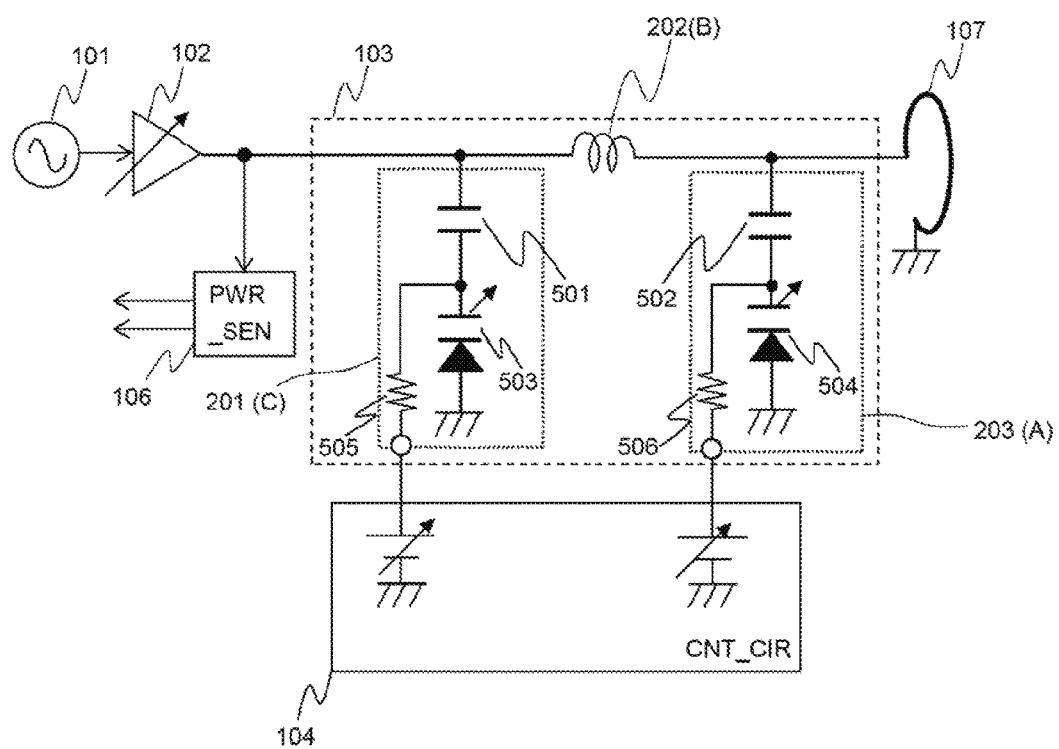
FIG. 5 is a diagram exemplifying an embodiment of the resonance frequency adjustment circuit 103.
Figure 6:
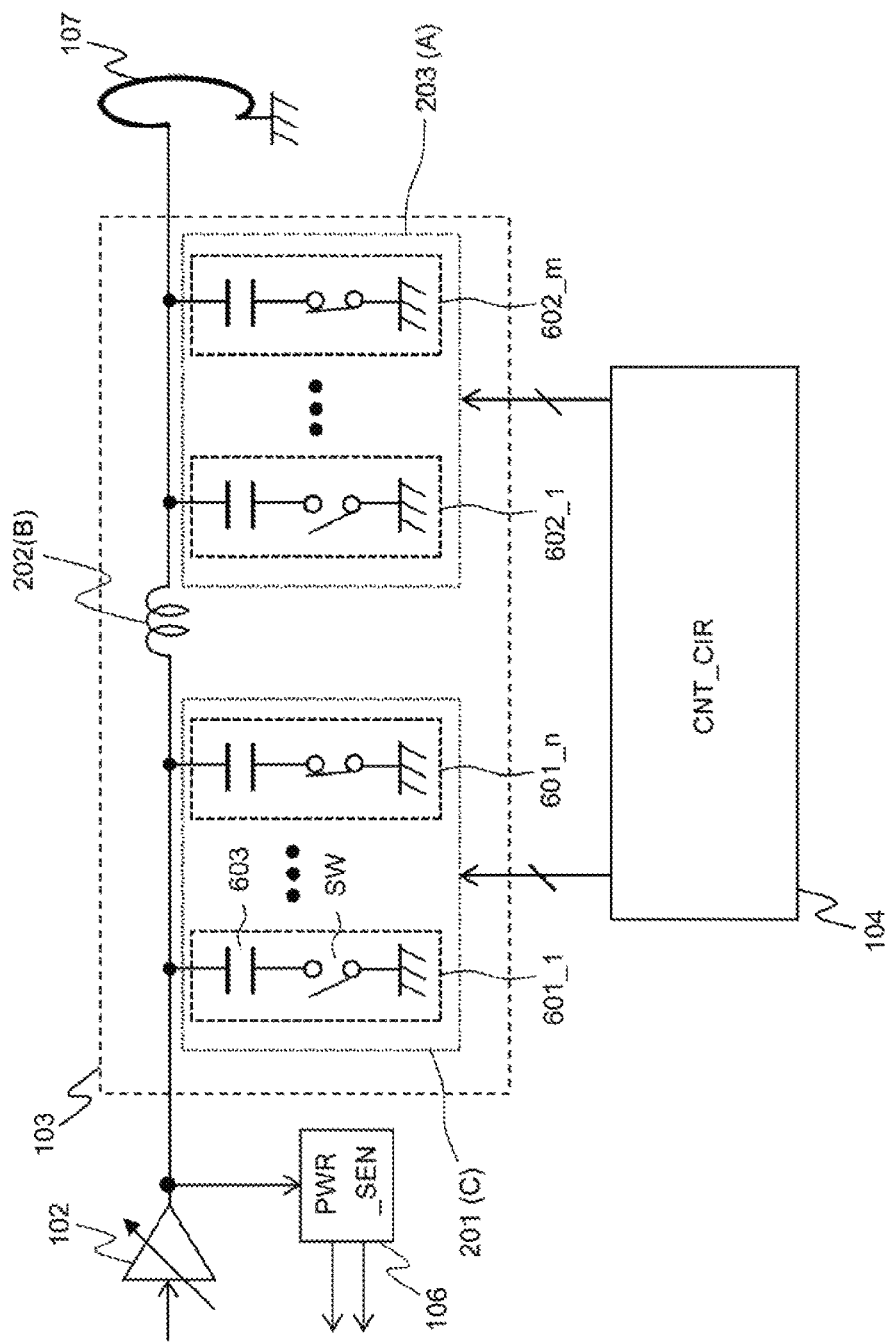
FIG. 6 is a diagram exemplifying another embodiment of the resonance frequency adjustment circuit 103.

Next, two representative examples are illustrated in FIGS. 5 and 6 as specific circuit configurations for implementing the resonance frequency adjustment circuit 103.

FIG. 5 is a diagram exemplifying an embodiment of the resonance frequency adjustment circuit 103. As illustrated in FIG. 5, each of the variable capacitors 201 and 203 includes a variable capacitance diode (also referred to as a varicap diode). Specifically, the variable capacitor 201 includes a capacitor 501 which has one end connected to the output node of the power transmission amplifier 102, a variable capacitance diode 503 which is connected between the other end of the capacitor 501 and the ground node, and a resistor 505 connected to a connection node between the capacitor 501 and the variable capacitance diode 503. Similarly, the variable capacitor 203 includes a capacitor 502 which has one end connected to the power feeding coil 107, a variable capacitance diode 504 which is connected between the other end of the capacitor 502 and the ground node, and a resistor 506 connected to a connection node between the capacitor 502 and the variable capacitance diode 504. Respective capacitance values of the variable capacitance diodes 503 and 504 are changed depending on magnitudes of bias voltages which are applied to cathode sides of the variable capacitance diodes 503 and 504 via the resistors 505 and 506. Specifically, the control circuit 104 changes capacitance values of the variable capacitors 201 and 203 by adjusting bias voltages applied to the variable capacitance diodes 503 and 504, so as to adjust a resonance frequency of the resonance circuit 110.

According to the above-described configuration, it is possible to easily change capacitance values of the variable capacitors 201 and 203.

FIG. 6 is a diagram exemplifying another embodiment of the resonance frequency adjustment circuit 103. As illustrated in FIG. 6, each of the variable capacitors 201 and 203 is constituted of a plurality of circuits each including a capacitive element and a switch circuit connected in series to each other. Specifically, the variable capacitor 201 includes a plurality of capacitance circuits 601 each of which includes a capacitor 603 whose one end is connected to the output node of the power transmission amplifier 102 and a switch circuit SW which is connected between the other end of the capacitor 603 and the ground node, the capacitance circuits 601 being connected in parallel to each other. In the same manner as the variable capacitor 201, the variable capacitor 203 also has a configuration in which a plurality of capacitance circuits 602 are connected in parallel to each other. Turning-on and turning-off of each switch circuit SW can be controlled by the control circuit 104. Consequently, it is possible to easily change capacitance values of the variable capacitors 201 and 203. In addition, FIG. 6 exemplifies a case where n (where n is an integer of 2 or greater) capacitance circuits 601_1 to 601_n are provided as the variable capacitor 201, and m (where m is an integer of 2 or greater) capacitance circuits 602_1 to 602_m are provided as the variable capacitor 203. By increasing n and m, it is possible to increase an adjustment width of a resonance frequency and also to adjust a resonance frequency at a fine adjustment interval.

Figure 7:
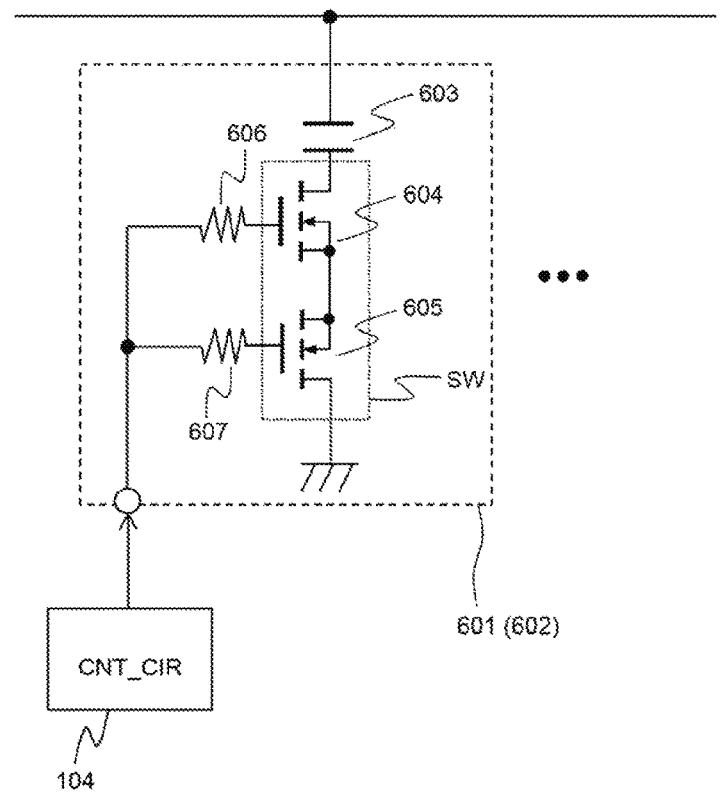
FIG. 7 is a diagram exemplifying an internal configuration of a switch circuit SW.

FIG. 7 exemplifies an internal configuration of the switch circuit SW. As illustrated in FIG. 7, the switch circuit SW has a configuration in which a transistor 604 and a transistor 605 are connected in series to each other. The transistors 604 and 605 are, for example, field effect transistors. Mutual source electrodes and backgate electrodes of the transistors 604 and 605 are respectively connected to each other. Specifically, a drain electrode of the transistor 604 is connected to the other end of the capacitor 603, and the source electrode and the backgate electrode of the transistor 604 are connected to the source electrode and the backgate electrode of the transistor 605. A drain electrode of the transistor 605 is connected to the ground node. A resistor 606 is connected to the gate electrode of the transistor 604, and a resistor 607 is connected to the gate electrode of the transistor 605. A common control signal is supplied to the gate electrodes of the transistors 604 and 605 from the control circuit 104, and thus turning-on and turning-off of the transistors 604 and 605 are controlled. For example, if a control signal with a high level is applied to the gate electrodes of the transistors 604 and 605, the field effect transistors 604 and 605 are turned on, and thus the capacitor 603 is grounded so that a resonance frequency is changed so as to be reduced. On the other hand, for example, if a control signal with a low level is applied to the gate electrodes of the transistors 604 and 605, the field effect transistors 604 and 605 are turned off, and thus one end of the capacitor 603 is opened so that a resonance frequency is changed so as to be increased.

Consequently, the switch circuit SW can be implemented by using a simple circuit configuration. Since the source electrodes and the backgate electrodes of the transistors 604 and 605 are respectively connected to each other, even in a case where a voltage of the node connected to the capacitor 603 becomes lower than the ground voltage, it is possible to prevent currents from leaking via parasitic diodes which are present between the backgate electrodes and the drain electrodes of the transistors 604 and 605 in a turning-off period of the transistors 604 and 605.

<Configuration of Power Amount Detection Unit 106>

As described above, the power amount detection unit 106 generates the voltage Vi corresponding to an incident power amount of a driving signal which is supplied from the power transmission amplifier 102 to the resonance circuit 110 side (the resonance frequency adjustment circuit 103), and the voltage Vr corresponding to a reflected power amount of the driving signal. As the power amount detection unit 106, for example, a CM type directional coupler may be used.

Figure 8:
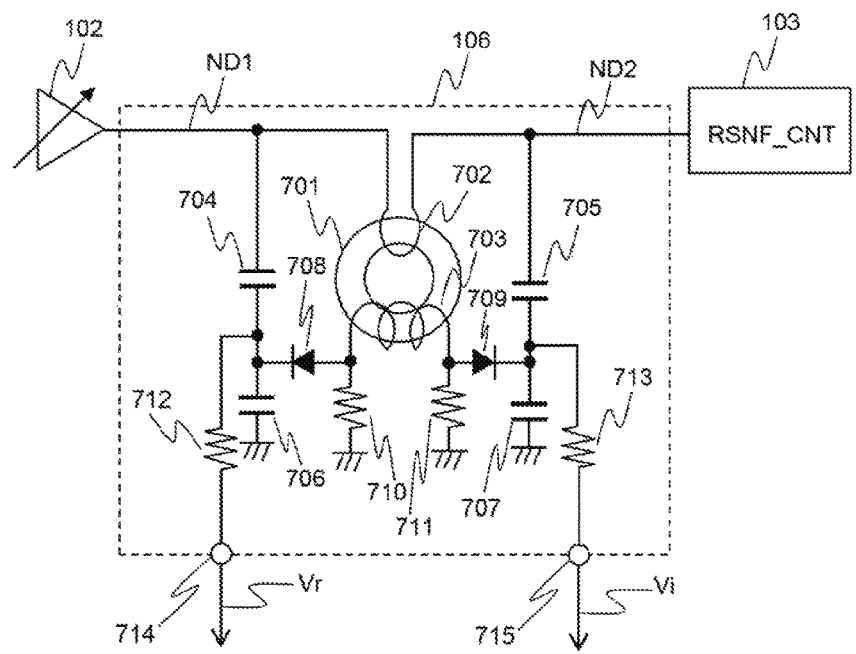
FIG. 8 is a diagram exemplifying an embodiment of a power amount detection unit 106.

FIG. 8 is a diagram illustrating an embodiment of the power amount detection unit 106. As illustrated in FIG. 8, the power amount detection unit 106 is configured to include a troidal core 701, a primary coil 702, a secondary coil 703, capacitors 704, 705, 706 and 707 detection diodes 708 and 709, a reflected power reference resistor 710, an input power reference resistor 711, resistors 712 and 713, a reflected voltage output terminal 714, and an incident voltage output terminal 715. In FIG. 8, the primary coil 702 is inserted between the power transmission amplifier 102 and the resonance frequency adjustment circuit 103, and both ends of the secondary coil 703 are connected to the ground node (grounded) via the reflected power reference resistor 710 and the input power reference resistor 711. The capacitor 705 and the capacitor 707 are connected in series to each other between a connection node ND2 of the resonance frequency adjustment circuit 103 and the primary coil 702, and the ground node. In addition, the capacitor 704 and the capacitor 706 are connected in series to each other between a connection node ND1 of the power transmission amplifier 102 and the primary coil 702, and the ground node. The detection diode 709 has an anode which is connected to a connection node of the secondary coil 703 and the input power reference resistor 711, and the detection diode 708 has a anode which is connected to a connection node of the secondary coil 703 and the reflected power reference resistor 710. The cathode of the detection diode 708 is connected to the reflected voltage output terminal 714 via the resistor 712. The cathode of the detection diode 709 is connected to the incident voltage output terminal 715 via the resistor 713.

With the above-described configuration, the voltage Vi corresponding to an incident power amount of a driving signal which is incident to the power feeding coil 107 side from the power transmission amplifier 102 is detected by the detection diode 709 and is output from the incident voltage output terminal 715. On the other hand, the voltage Vr corresponding to a reflected power amount of a reflected signal which is reflected toward the power transmission amplifier 102 side from the power feeding coil 107 side is detected by the detection diode 708 and is output from the reflected voltage output terminal 714. According to the configuration, it is possible to easily generate voltages corresponding to an incident power amount and a reflected power amount.

Figure 9:
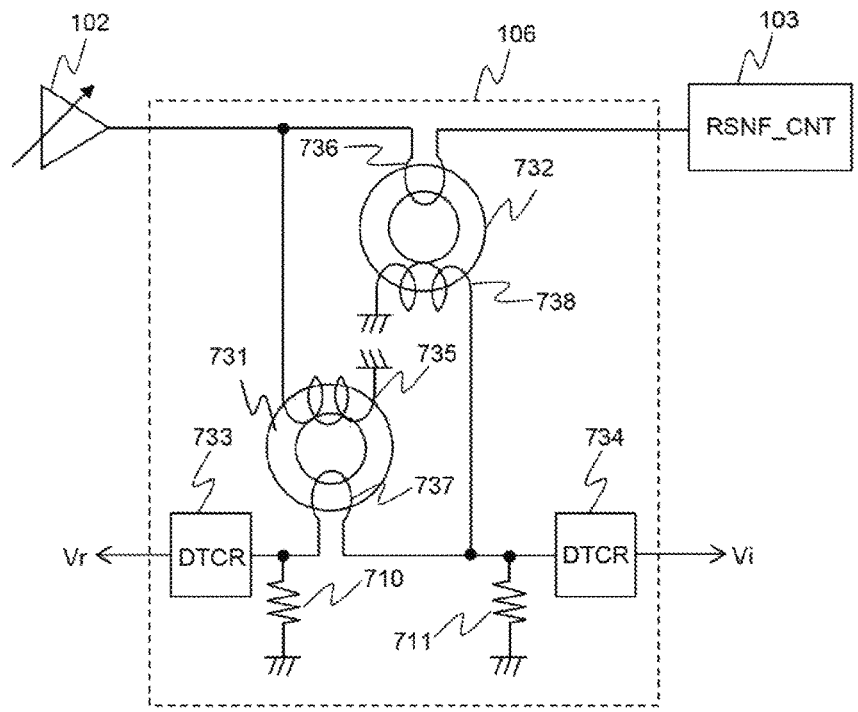
FIG. 9 is a diagram exemplifying another embodiment of the power amount detection unit 106.

FIG. 9 is a diagram exemplifying another embodiment of the power amount detection unit 106. As illustrated in FIG. 9, the power amount detection unit 106 is configured to include a troidal core 731, a troidal core 732, primary coils 735 and 736, secondary coils 737 and 738, detection circuits 733 and 734, a reflected power reference resistor 710, and an input power reference resistor 711.

The primary coil (having a larger number of turns) 735 of the troidal core 731 has one end which is connected to the output node of the power transmission amplifier 102 and the other end which is connected to the ground node (grounded). Both ends of the secondary coil 737 of the troidal core 731 are respectively connected to the ground node (grounded) via the reflected power reference resistor 710 and the input power reference resistor 711. The primary coil 736 (having a smaller number of turns) of the troidal core 732 has one end which is connected to the output node of the power transmission amplifier 102 and the other end which is connected to the resonance frequency adjustment circuit 103. The secondary coil 738 of the troidal core 732 has one end which is connected to the ground node and the other end which is connected to a connection node of the input power reference resistor 711 and the secondary coil 737. The detection circuit 733 has an input terminal which is connected to a connection node of the reflected power reference resistor 710 and the secondary coil 737. The detection circuit 734 has an input terminal which is connected to a connection node of the input power reference resistor 711 and the secondary coils 737 and 738.

According to the above-described configuration, a voltage corresponding to an incident power amount of a driving signal which is incident to the power feeding coil 107 side from the power transmission amplifier 102 is developed across both ends of the input power reference resistor 711 via the troidal core 732. The detection circuit 734 detects the voltage developed across both ends of the input power reference resistor 711 and outputs a DC voltage corresponding to the detection result as the voltage Vi corresponding to the incident power amount. On the other hand, a voltage corresponding to a reflected power amount of a reflected signal which is reflected toward the power transmission amplifier 102 side from the power feeding coil 107 side is developed across both ends of the reflected power reference resistor 710 via the troidal core 731. The detection circuit 733 detects the voltage developed across both ends of the reflected power reference resistor 710 and outputs a DC voltage corresponding to the detection result as the voltage Vr corresponding to the reflected power amount. According to the above-described configuration, it is possible to easily generate voltages corresponding to an incident power amount and a reflected power amount.

In addition, in FIGS. 8 and 9, impedance which is used as incidence and reflection can be set by using the reflected power reference resistor 710 and the input power reference resistor 711. As the reflected power reference resistor 710 and the input power reference resistor 711, for example, resistors of 50Ω may be used but are only examples.

<Determination of Foreign Substance Present within Power Transmission Region in Wireless Power Feeding System>

If there is a foreign substance within a power transmission region of the power transmission device 1, some of power transmitted from the power transmission device 1 to the power reception device 2 is absorbed by the foreign substance, thus power transmission efficiency in the wireless power feeding system 3 is reduced, and there is also a concern that the foreign substance may be damaged due to heat generation. As described above, in the related art, in a case where a foreign substance is present within a power transmission region, safety control such as stoppage of power transmission is performed regardless of whether or not the foreign substance is a foreign substance influencing wireless power transmission, and thus it cannot be said that reliability of a wireless power transmission system is high.

Whether or not a foreign substance influences wireless power transmission differs depending on a material of the foreign substance and the power transmission frequency fTx as described above. For example, as in the present embodiment, in the wireless power feeding system 3 using the power transmission frequency fTx of several MHz band close to a frequency (13.65 MHz) of NFC communication, if a foreign substance is an IC card or the like conforming to the NFC standard, an amount of transmission power absorbed by the foreign substance tends to be increased, and if a foreign substance is a metal, an amount of transmission power absorbed by the foreign substance tends to be decreased.

In addition, according to the examination of the inventor of this application, in the wireless power feeding system, in a case where a foreign substance enters a power transmission region during power transmission, if the foreign substance is a metal, a resonance frequency tends to be deviated to a higher side, and if the foreign substance is an IC card or the like covered with nonmetallic plastic, the resonance frequency tends to be deviated to a lower side.

Therefore, in the present wireless power feeding system 3, in a case where a resonance frequency of the resonance circuit 110 is deviated during power transmission, the power transmission device 1 detects a direction in which the resonance frequency is deviated, and controls a power transmission process on the basis of a detection result thereof. Consequently, it is possible to determine not only whether or not a foreign substance is present in a power transmission region but also determines whether or not the foreign substance influences wireless power transmission with high accuracy, and thus reliability of the wireless power feeding system can be improved. Specifically, the power transmission device 1 determines continuation or stoppage of power transmission on the basis of the detection result. Hereinafter, details thereof will be described.

Figure 10:
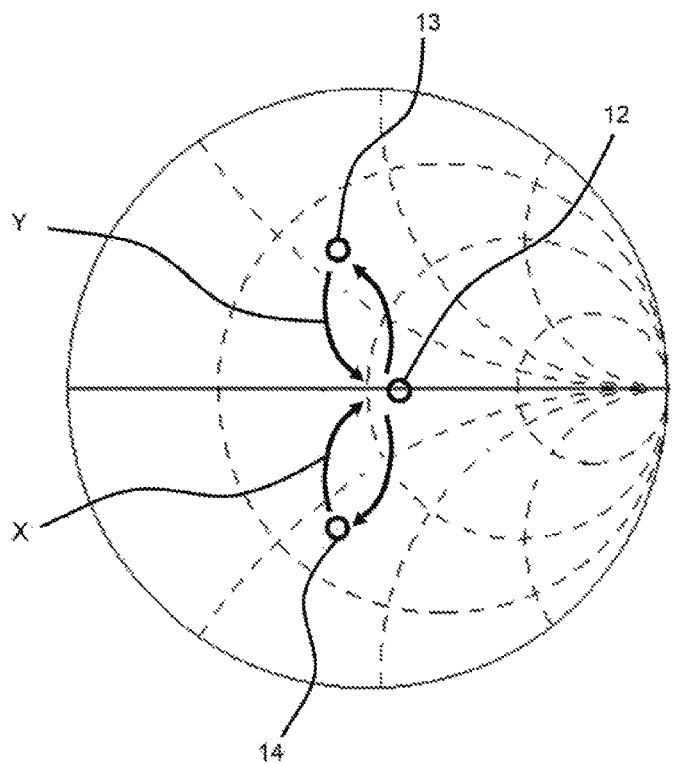
FIG. 10 is a Smith chart illustrating impedance when a power feeding coil 107 side is viewed from a power transmission amplifier 102.

The power transmission device 1 detects a reflected power amount of a signal related to power transmission while changing impedance (a resonance frequency of the resonance circuit 110) of the resonance frequency adjustment circuit 103, and determines a direction in which the resonance frequency is deviated by determining a change direction (increase or decrease) of the reflected power amount on the basis of the detection result. With reference to FIGS. 10 and 11, a description will be made of the determination of a direction in which the resonance frequency is deviated based on a change direction of the reflected power amount.

FIG. 10 is a Smith chart illustrating impedance when the power feeding coil 107 side is viewed from the power transmission amplifier 102. FIG. 10 illustrates a case where impedance of the power feeding coil 107 is moved by adjusting impedance of the resonance frequency adjustment circuit 103.

In FIG. 10, the reference numeral 12 indicates impedance when the power feeding coil 107 side is viewed from the power transmission amplifier 102 in a case where the resonance frequency of the resonance circuit 110 is set to match the power transmission frequency fTx.

In a case where a metal as a foreign substance enters a power transmission region, the resonance frequency is deviated to a higher side, and impedance when the power feeding coil 107 side is viewed from the power transmission amplifier 102 is located at a position of the reference numeral 13, for example. In this case, if capacitance values of the variable capacitors 201 and 203 of the resonance frequency adjustment circuit 103 are increased so that the resonance frequency is reduced, the impedance is moved in a Y direction and can thus become close to the position indicated by the reference numeral 12. On the other hand, in a case where a non-metal such as an IC card as a foreign substance enters the power transmission region, the resonance frequency is deviated to a lower side, and impedance when the power feeding coil 107 side is viewed from the power transmission amplifier 102 is located at a position of the reference numeral 14, for example. In this case, if capacitance values of the variable capacitors 201 and 203 of the resonance frequency adjustment circuit 103 are decreased so that the resonance frequency is increased, the impedance is moved in an X direction and can thus become close to the position indicated by the reference numeral 12.

FIG. 11 is a diagram illustrating a resonance frequency obtained when impedance of the resonance frequency adjustment circuit 103 is changed. In FIG. 11, a transverse axis expresses a frequency, and a longitudinal axis expresses a reflected power amount (return loss) of a signal. The reference numeral 400 indicates a reflection characteristic when a resonance frequency of the resonance circuit 110 matches the power transmission frequency fTx, the reference numeral 401 indicates a reflection characteristic when the resonance frequency is deviated to a region lower than the power transmission frequency fTx, and the reference numeral 402 indicates a reflection characteristic when the resonance frequency is moved to a region higher than the power transmission frequency fTx.

When the resonance frequency is deviated to the region higher than the power transmission frequency fTx as indicated by the reference numeral 402, the resonance frequency is moved in a direction in which the resonance frequency is lowered if increasing capacitance values of the variable capacitors 201 and 203. On the contrary, when the resonance frequency is deviated to the region lower than the power transmission frequency fTx as indicated by the reference numeral 403, the resonance frequency is moved in a direction in which the resonance frequency is heightened if decreasing capacitance values of the variable capacitors 201 and 203. Therefore, a reflected power amount is measured while deviating capacitance values (resonance frequency) of the variable capacitors 201 and 203 of the resonance frequency adjustment circuit 103, and it is determined whether or not the reflected power amount is increased (decreased) relative to directions in which the capacitance values of the variable capacitors 201 and 203 are changed, so that it is possible to estimate in which direction the resonance frequency is deviated. Further, it is also possible to estimate to what extent the resonance frequency is deviated on the basis of amounts of change of the capacitance values of the variable capacitors 201 and 203.

Specifically, the power transmission device 1 determines a direction in which a resonance frequency is deviated according to the following three methods, for example.

First, if a deviation of the resonance frequency is detected during power transmission, the control circuit 104 adjusts impedance of the resonance frequency adjustment circuit 103 so that a resonance frequency of the resonance circuit 110 is heightened, and determines whether a reflected power amount is increased or decreased on the basis thereof. For example, in a case where the reflected power amount is increased through the adjustment, it is determined that the resonance frequency is deviated in a direction of becoming higher than the power transmission frequency fTx. On the contrary, in a case where the reflected power amount is decreased, it is determined that the resonance frequency is deviated in a direction of becoming lower than the power transmission frequency fTx. Consequently, it is possible to determine a direction in which the resonance frequency is deviated simply and highly accurately.

Second, if a deviation of the resonance frequency is detected during power transmission, the control circuit 104 adjusts impedance of the resonance frequency adjustment circuit 103 so that a resonance frequency of the resonance circuit 110 is lowered, and determines whether a reflected power amount is increased or decreased on the basis thereof. For example, in a case where the reflected power amount is increased through the adjustment, it is determined that the resonance frequency is deviated in a direction of becoming lower than the power transmission frequency fTx. On the contrary, in a case where the reflected power amount is decreased, it is determined that the resonance frequency is deviated in a direction of becoming higher than the power transmission frequency fTx. Consequently, it is possible to determine a direction in which the resonance frequency is deviated simply and highly accurately.

A third method is obtained by combining the two methods with each other. In other words, if a deviation of the resonance frequency is detected during power transmission, the control circuit 104 determines a direction in which the resonance frequency is deviated on the basis of a change direction of the reflected power amount when adjusting impedance of the resonance frequency adjustment circuit 103 so that a resonance frequency of the resonance circuit 110 is lowered, and a change direction of the reflected power amount when adjusting impedance of the resonance frequency adjustment circuit 103 so that a resonance frequency of the resonance circuit 110 is heightened. Consequently, it is possible to determine a direction in which the resonance frequency is deviated with higher accuracy.

Although not particularly limited, a change direction and a change amount of the reflected power amount can be estimated on the basis of a change direction and a change amount of the voltage standing wave ratio VSWR. For example, the voltage standing wave ratio VSWR is calculated by using (Equation 2).

$$VSWR = (Vi+Vr)/(Vi-Vr) \quad \text{[Equation 2]}$$

The control circuit 104 calculates the voltage standing wave ratio VSWR on the basis of the voltage Vi and the voltage Vr generated by the power amount detection unit 106 so as to estimate the reflected power amount. For example, in a case where the voltage standing wave ratio VSWR is increased by changing capacitance values of the variable capacitors 201 and 203, it is determined that the reflected power amount is increased, and, in a case where the voltage standing wave ratio VSWR is decreased, it is determined that the reflected power amount is decreased. Consequently, it is possible to determine a change direction of the reflected power amount simply and highly accurately.

If a deviation direction of the resonance frequency is determined according to the above-described determination methods, the control circuit 104 determines whether or not the foreign substance is a foreign substance influencing the wireless power transmission according to the determination result, and controls continuation and stoppage of power transmission.

FIG. 12 is a diagram illustrating an example of a foreign substance determination reference according to the first embodiment.

As illustrated in FIG. 12, in a case where the resonance frequency is deviated in a direction of being heightened, the control circuit 104 determines that a foreign substance 120 is a foreign substance (metal) which does not influence the wireless power transmission (determination of OK), and continues to transmit power. On the other hand, in a case where the resonance frequency is deviated in a direction of being lowered, the control circuit 104 determines that the foreign substance 120 is a foreign substance (an IC card or the like) which does not influence the wireless power transmission (determination of NG), and stops transmitting power.

According to the above-described control, in a case where, for example, an IC card conforming to the NFC standard is present as a foreign substance, power transmission is stopped, and thus it is possible to prevent the IC card from being damaged due to heat generation. On the other hand, in a case where a metal which absorbs a small amount of power is present as a foreign substance, power transmission is not stopped, and thus it is possible to transmit power more efficiently than in control for stopping power transmission only based on determination of the presence or absence of a foreign substance.

<Process Flow of Power Transmission Control in Wireless Power Feeding System 3>

Figure 13:
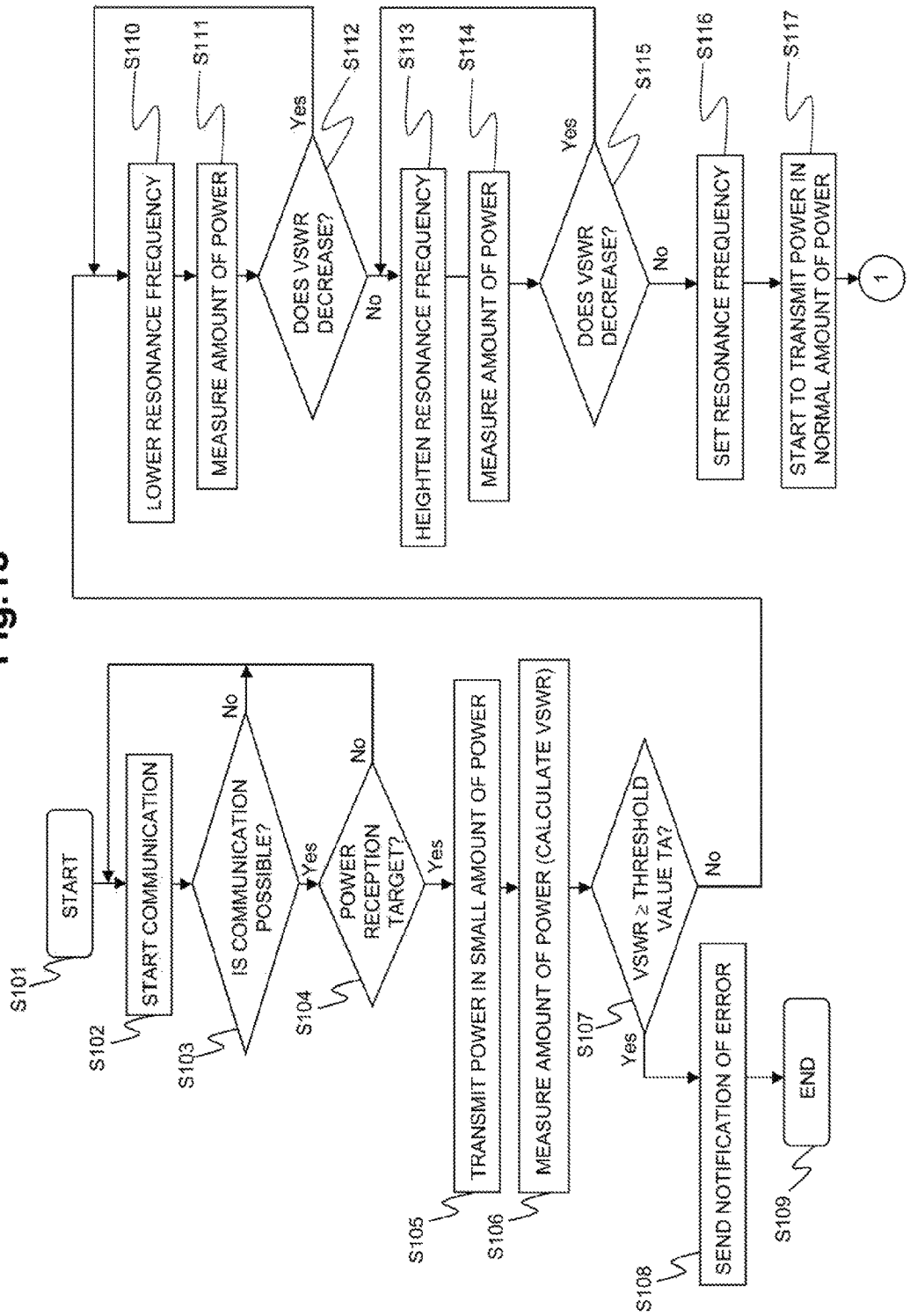
FIG. 13 is a flowchart illustrating an example of a flow of processes until power transmission is started in a wireless power feeding system 1.
Figure 14:
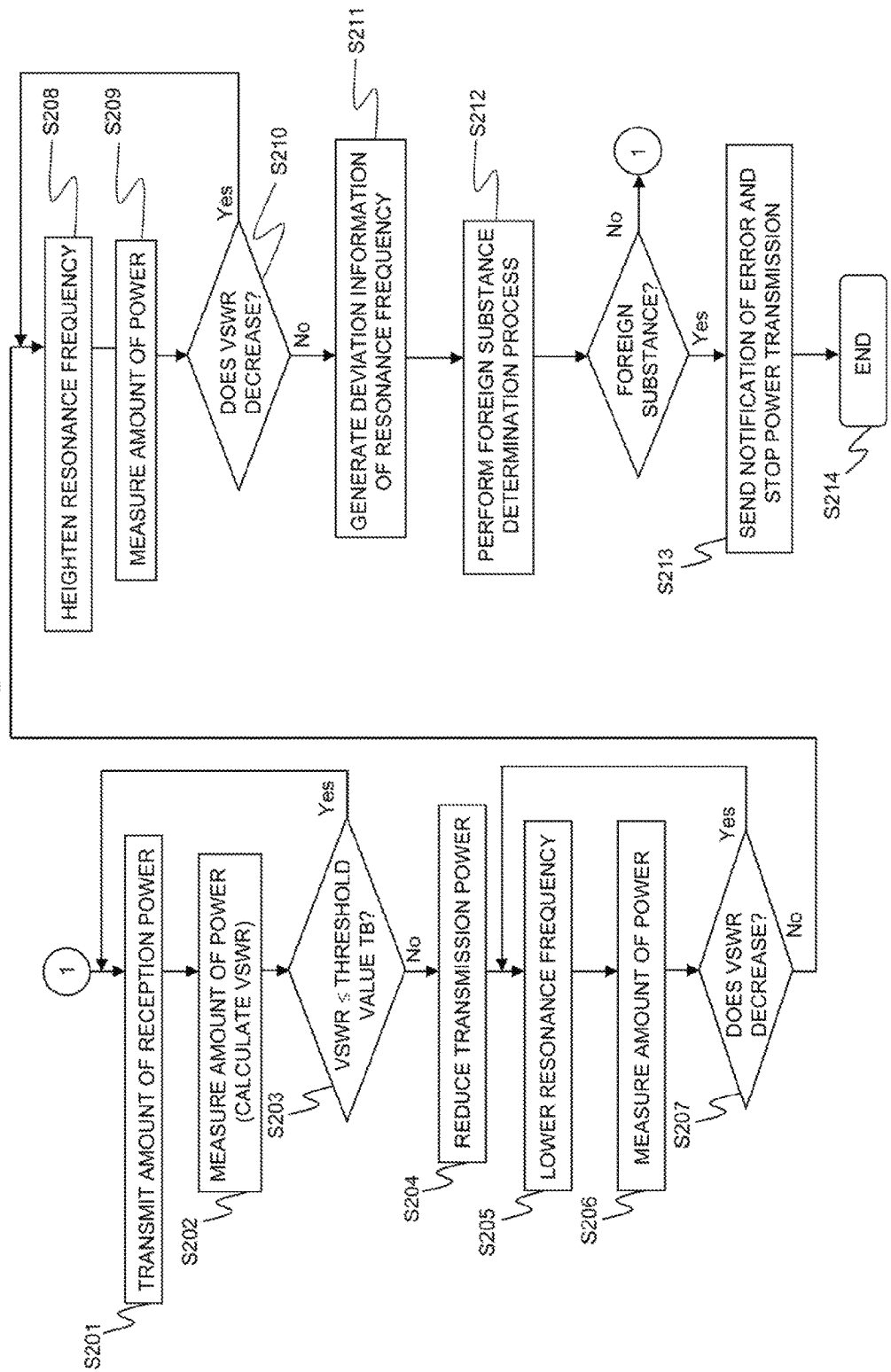
FIG. 14 is a flowchart illustrating an example of a flow of processes in a case where a foreign substance becomes close to the wireless power feeding system 1.

With reference to FIGS. 13 and 14, a detailed description will be made of a flow of a power transmission control process in the wireless power feeding system 3.

FIG. 13 is a flowchart illustrating an example of a flow of processes until power transmission is started in a wireless power feeding system 1. The flowchart of FIG. 13 exemplifies a flow of processes, for example, until power is transmitted after it is detected that the power reception device 2 is present in a power transmission region of the power transmission device 1.

For example, if the power transmission device 1 is powered on, and thus the power transmission device 1 enters an operable state, processes related to the power transmission control are started (step S101). First, the power transmission device 1 transmits data from the antenna 111 so as to perform wireless communication with the power reception device (step S102). The communication unit 105 of the power transmission device 1 determines whether or not a communicable power reception device is present within a communication area on the basis of the presence or absence of a response to the transmitted data (step S103). If there is no communicable power reception device, transmission of data is repeatedly performed (step S102). If there is a communicable power reception device, the power transmission device 1 performs wireless communication with the power reception device so as to perform authentication of whether or not the power reception device is a power transmission target (step S104). As a result of the authentication, if it is determined that the power reception device is not a power transmission target, the flow returns to step S102, and the power transmission device 1 resumes transmission of data. As a result of the authentication, if it is determined that the power reception device is a power transmission target, the power transmission device 1 starts to transmit power in an amount of power lower than at normal times (step S105). Specifically, the control circuit 104 changes an amplification factor of the power transmission amplifier 102 so that an amount of power lower than an amount of power during normal power transmission is obtained. Consequently, even in a case where the foreign substance is present in the power transmission region of the power transmission device 1 from the beginning, an influence on the foreign substance can be reduced.

The power transmission device 1 measures the voltage Vi corresponding to an incident power amount and the voltage Vr corresponding to a reflected power amount in a period in which power is transmitted in the amount of power lower than during the normal power transmission, and calculates the voltage standing wave ratio VSWR by using the control circuit 104 (step S106). The control circuit 104 determines whether or not a value of the calculated VSWR is equal to or greater than a preset threshold value TA (step S107). If the value of the calculated VSWR is equal to or greater than the preset threshold value TA, it may be determined that the power reception device 2 is not located near the power transmission antenna, coupling between the power transmission and reception coils is insufficient, and thus power reflection increases. In this case, the control circuit 104 performs a notification of error information indicating that the power reception device 2 is not located at a normal position (step S108). A method of performing a notification of error information is not particularly limited as long as the notification of error information is performed to outside. For example, there may be a method in which the error information is displayed on a display unit (not illustrated) such as a display provided in the power transmission device 1 or warning sound is generated, or the error information is transmitted to the power reception device 2 by performing communication with the power reception device 2. After the notification of the error information is performed, the power transmission device 1 stops the power transmission and finishes the power transmission process (step S109).

In step S107, if the value of the calculated VSWR is not equal to or greater than the present threshold value TA, the control circuit 104 changes a resonance frequency of the resonance circuit 110 in one direction by a predetermined amount (step S110). For example, the control circuit 104 lowers the resonance frequency by increasing capacitance values of the variable capacitors 201 and 203 of the resonance frequency adjustment circuit 103 by predetermined amounts. In addition, the control circuit 104 calculates the voltage standing wave ratio VSWR on the basis of the voltage Vi and the voltage Vr detected by the power amount detection unit 106 (step S111). The control circuit 104 compares a value of VSWR before the resonance frequency is changed and a value of VSWR after the resonance frequency is changed, so as to determine whether or not the value of VSWR increases (step S112). As a result of the determination, if the value of VSWR decreases, it can be recognized that the resonance frequency is deviated in a direction of being heightened, and thus a process of calculating VSWR by further lowering the resonance frequency by a predetermined amount and comparing values of VSWR before and after the resonance frequency is changed is repeatedly performed until the value of VSWR is changed to increase (steps S110 to S112).

As a result of the determination in step S112, if the value of VSWR increases, the control circuit 104 reverses a direction in which the resonance frequency is changed, and performs the same processes as in steps S110 to S112. For example, the control circuit 104 heightens the resonance frequency by reducing capacitance values of the variable capacitors 201 and 203 of the resonance frequency adjustment circuit 103 by a predetermined amount (step S113). In addition, the control circuit 104 calculates the voltage standing wave ratio VSWR on the basis of the voltage Vi and the voltage Vr detected by the power amount detection unit 106 (step S114). The control circuit 104 compares a value of VSWR before the resonance frequency is changed and a value of VSWR after the resonance frequency is changed, so as to determine whether or not the value of VSWR increases (step S115). As a result of the determination, if the value of VSWR decreases, it can be recognized that the resonance frequency is deviated in a direction of being lowered, and thus a process of calculating VSWR by further heightening the resonance frequency by a predetermined amount and comparing values of VSWR before and after the resonance frequency is changed is repeatedly performed until the value of VSWR increases (steps S113 to S115).

As a result of the determination in step S115, if the value of VSWR decreases, the control circuit 104 sets a resonance frequency of the resonance circuit 110 on the basis of the results of the processes in steps S110 to S115 (step S116). For example, impedance of the resonance frequency adjustment circuit 103 is set so that the resonance frequency which is set right before the value of VSWR is changed to increase in step S115 is obtained. Consequently, a resonance frequency obtained when a reflected power amount (a value of VSWR) is smallest is set.

Next, the power transmission device 1 starts to transmit power in a normal amount of power (step S117). Specifically, the control circuit 104 changes an amplification factor of the power transmission amplifier 102 so that an amount of power larger than the amount of power set in step S105 is obtained. Consequently, an operation of feeding power to the power reception device 2 is started.

According to the above-described process, it becomes easier to search for a resonance frequency which causes the smallest reflected power amount and set the resonance frequency in the resonance circuit 110 of the power transmission side. Thus, it is possible to realize wireless power transmission with high efficiency. In addition, since power transmission is first started in a small amount of power and then power transmission is started in an increasing amount of power, even in a case where a foreign substance is already present at the time of starting of the power transmission, an influence on the foreign substance can be reduced. Therefore, it is possible to increase reliability of power transmission control in the wireless power transmission system.

FIG. 14 is a flowchart illustrating an example of a flow of processes in a case where a foreign substance becomes close to the wireless power feeding system 3. The flowchart of FIG. 14 exemplifies a flow of processes, for example, in a case where a foreign substance becomes close after the power transmission device 1 starts power transmission in a normal amount of power.

For example, if power transmission is started in a normal amount of power in step S117 of FIG. 13, the power reception device 2 transmits information regarding the amount of reception power to the power transmission device 1 (step S201). For example, the power reception device 2 calculates the amount of reception power, and transmits information regarding the amount of power to the power transmission device 1 through wireless communication. The power transmission device 1 measures the voltage Vi corresponding to an incident power amount and the voltage Vr corresponding to a reflected power amount so as to calculate the voltage standing wave ratio VSWR by using the control circuit 104 (step S202). The control circuit 104 determines whether or not a value of the calculated VSWR is equal to or smaller than a preset threshold value TB (step S203). If the value of the calculated VSWR is equal to or smaller than the preset threshold value TB, the power transmission device 1 determines that power is efficiently transmitted to the power reception device 2 so as to continue to transmit power and to wait for transmission of information regarding an amount of reception power from the power reception device 2 again (step S201).

In step S203, if the value of VSWR exceeds the threshold value TB, there is a possibility that a foreign substance may enter a power transmission region of the power transmission device 1, and thus the power transmission device 1 reduces an amount of transmission power (step S204). Subsequently, the power transmission device 1 changes a resonance frequency of the resonance circuit 110 in one direction by a predetermined amount (step S205). For example, the control circuit 104 of the power transmission device 1 lowers the resonance frequency by predetermined amounts by increasing capacitance values of the variable capacitors 201 and 203 of the resonance frequency adjustment circuit 103. In addition, the control circuit 104 calculates the voltage standing wave ratio VSWR on the basis of the voltage Vi and the voltage Vr detected by the power amount detection unit 106 (step S206). The control circuit 104 compares a value of VSWR before the resonance frequency is changed and a value of VSWR after the resonance frequency is changed, so as to determine whether or not the value of VSWR decreases (step S207). As a result of the determination, if the value of VSWR decreases, it can be recognized that the resonance frequency is deviated in a direction of being heightened due to the entry of the foreign substance, and thus a process of calculating VSWR by further lowering the resonance frequency by a predetermined amount and comparing values of VSWR before and after the resonance frequency is changed is repeatedly performed until the value of VSWR is changed to increase (steps S205 to S207).

As a result of the determination in step S207, if the value of VSWR increases, the control circuit 104 reverses a direction in which the resonance frequency is changed, and performs the same processes as in steps S205 to S207. For example, the control circuit 104 heightens the resonance frequency by a predetermined amount by reducing capacitance values of the variable capacitors 201 and 203 of the resonance frequency adjustment circuit 103 (step S208). In addition, the control circuit 104 calculates the voltage standing wave ratio VSWR on the basis of the voltage Vi and the voltage Vr detected by the power amount detection unit 106 (step S209). The control circuit 104 compares a value of VSWR before the resonance frequency is changed and a value of VSWR after the resonance frequency is changed, so as to determine whether or not the value of VSWR increases (step S210). As a result of the determination, if the value of VSWR decreases, it can be recognized that the resonance frequency is deviated in a direction of being lowered due to the entry of the foreign substance, and thus a process of calculating VSWR by further heightening the resonance frequency by a predetermined amount and comparing values of VSWR before and after the resonance frequency is changed is repeatedly performed until the value of VSWR is changed to increase (steps S208 to S210).

If the value of VSWR is changed to increase, the control circuit 104 estimates a resonance frequency which causes a value of VSWR (reflected power amount) to become smallest, and generates deviation information of the resonance frequency, including a deviation direction of the resonance frequency on the basis of the estimated resonance frequency (step S211). In addition, the control circuit 104 performs a foreign substance determination process on the basis of the deviation information of the resonance frequency (step S212). Specifically, the control circuit 104 performs the foreign substance determination process on the basis of the deviation direction of the resonance frequency as illustrated in FIG. 12. For example, if it is determined that the resonance frequency is deviated in a direction of being heightened, the control circuit 104 determines that the foreign substance is a foreign substance (metal) which does not influence wireless power transmission, corrects the deviation of the resonance frequency, and continues to transmit power (step S201). Here, the correction of the deviation of the resonance frequency is performed by setting impedance of the resonance frequency adjustment circuit 103 so that the resonance frequency which is set right before the value of VSWR is changed to increase in step S210 is obtained, in the same manner as in the above-described step S116.

On the other hand, if it is determined that the resonance frequency is deviated in a direction of being lowered, the control circuit 104 determines that the foreign substance is a foreign substance (an IC card or the like) which influences the wireless power transmission, stops power transmission, and also sends a notification of error information indicating that the power transmission is stopped due to the entry of the foreign substance (step S213). The notification of the error information is not particularly limited in methods thereof as long as an external device is notified of errors in the same manner as in the above-described step S108. Thereafter, the power transmission device 1 finishes the power transmission process (step S214).

As described above, according to the power transmission device 1 according to the first embodiment, it is possible to determine not only whether or not a foreign substance is present in a power transmission region of the wireless power feeding system but also whether or not the foreign substance is a foreign substance influencing wireless power transmission with high accuracy, and thus to improve reliability of the wireless power feeding system.

Second Embodiment

In a wireless power feeding system using the power transmission frequency fTx of several MHz band close to a frequency of NFC communication, in a case where a metal is present as a foreign substance, there is a case where an influence on power transmission efficiency cannot be disregarded depending on a size (surface area) of the metal. For example, if a foreign substance is a small metal (having a small surface area), an amount of transmission power absorbed by the foreign substance is small, and thus an influence on power transmission efficiency can be disregarded. However, if a foreign substance is a large metal (having a large surface area), an amount of transmission power absorbed by the foreign substance is large, and thus there is a concern that power transmission efficiency may be considerably reduced.

In addition, in a case where a foreign substance is a metal, if a surface area of the metal is large, the extent of deviation of a resonance frequency tends to increase, and if the surface area thereof is small, the extent of deviation of the resonance frequency tends to decrease. On the other hand, in a case where a foreign substance is a non-metal, if the foreign substance is an IC card or the like, the extent of deviation of a resonance frequency tends to decrease, and if the foreign substance is objects (for example, a human body) other than the IC card or the like, the extent of deviation of the resonance frequency tends to increase.

Therefore, in the present embodiment, foreign substance determination accuracy is increased by determining a foreign substance on the basis of the extent of deviation of a resonance frequency in addition to a deviation direction of the resonance frequency. In addition, remaining control and a configuration of a wireless power feeding system 3 related thereto are the same as those in the first embodiment.

Specifically, in the above-described steps S205 to S211, the control circuit 104 calculates a value of VSWR (reflected power amount) while changing capacitance values of the variable capacitors 201 and 203, and estimates the extent of deviation of a resonance frequency on the basis of amounts of change of the variable capacitors 201 and 203 until a value of VSWR becomes smallest. In addition, in step S211, the control circuit 104 generates the estimated value of the extent of deviation of the resonance frequency as information regarding deviation of the resonance frequency along with information regarding the deviation direction of the resonance frequency. In a case where the extent of deviation of the resonance frequency exceeds a predetermined threshold value, the control circuit 104 determines that the extent of deviation is considerable, and in a case where the extent of deviation of the resonance frequency does not exceed the predetermined threshold value, the control circuit determines that the extent of deviation is slight.

FIG. 15 is a diagram illustrating an example of a foreign substance determination reference according to the second embodiment.

The control circuit 104 determines whether or not a foreign substance influences wireless power transmission on the basis of a deviation direction of the resonance frequency and the extent of deviation of the resonance frequency in the foreign substance determination process (step S212). For example, as illustrated in FIG. 15, in a case where the resonance frequency is deviated in a direction of being heightened, and the extent of deviation of the resonance frequency is considerable, it is determined that the foreign substance (a relatively large metal) influences the wireless power transmission (determination of NG), and thus power transmission is stopped. In addition, in a case where the resonance frequency is deviated in a direction of being heightened, and the extent of deviation of the resonance frequency is slight, it is determined that the foreign substance (a relatively small metal) influences the wireless power transmission (determination of OK), and thus power transmission is continued. Further, in a case where the resonance frequency is deviated in a direction of being lowered, power transmission is stopped regardless of the extent of deviation of the resonance frequency.

Consequently, it is possible to determine whether or not a foreign substance influencing wireless power transmission is present with higher accuracy, and thus this contributes to improving reliability of the wireless power feeding system. For example, in a case where a foreign substance is a metal, power feeding is stopped if the foreign substance is a metal in which an amount of absorbed power is relatively large, and power feeding is continued if the foreign substance is a metal in which an amount of absorbed power is relatively small. Thus, it is possible to more efficiently transmit power in the wireless power feeding system.

Third Embodiment

In the first and second embodiments, it is determined whether or not a foreign substance influences wireless power transmission on the basis of a deviation direction of a resonance frequency and the extent of deviation of the resonance frequency, but, in a third embodiment, the determination is performed by taking into consideration to what extent transmission power is supplied to a power reception side.

In a case where a foreign substance is present in a power transmission region, it may be considered that a partial amount of power output from the power transmission device 1 is absorbed by the foreign substance, and the remaining amount of power is supplied to the power reception device 2. Therefore, the power transmission device 1 estimates an amount of power absorbed by the foreign substance on the basis of information regarding an amount of reception power, transmitted from the power reception device 2 through wireless communication, and information regarding an amount of transmission power, calculated by the power transmission device 1, and performs a determination of the foreign substance on the basis of the estimated value. For example, the control circuit 104 calculates a difference between the amount of transmission power and the amount of reception power, and uses the difference as an estimated value of an amount of power absorbed by the foreign substance. In a case where the estimated value exceeds a predetermined threshold value, the control circuit 104 determines that a foreign substance influencing wireless power transmission is present in the power transmission region, and in a case where the estimated value does not exceed a predetermined threshold value, the control circuit determines that a foreign substance influencing wireless power transmission is not present in the power transmission region.

FIG. 16 is a diagram illustrating an example of a foreign substance determination reference according to the third embodiment.

The control circuit 104 determines whether or not a foreign substance influences wireless power transmission on the basis of an estimated value of an amount of power absorbed by the foreign substance, a deviation direction of the resonance frequency, and the extent of deviation of the resonance frequency, in the foreign substance determination process (step S212). For example, as illustrated in FIG. 16, in a case where the estimated value (a difference between the amount of transmission power and the amount of reception power) of the amount of power absorbed by the foreign substance is equal to or greater than a predetermined threshold value, the control circuit 104 determines that a foreign substance influencing wireless power transmission is present in the power transmission region, and determines the kind of foreign substance so as to control a power transmission process. For example, in this case, it is determined that the resonance frequency is deviated in a direction of being heightened, the extent of deviation of the resonance frequency is considerable, and the foreign substance (a relatively large metal) influences the wireless power transmission (determination of NG), and thus power transmission is stopped. In a case where the resonance frequency is deviated in a direction of being heightened, and the extent of deviation of the resonance frequency is slight, it is determined that the foreign substance (a relatively small metal) influences the wireless power transmission (determination of OK), and thus power transmission is continued. In addition, in a case where the resonance frequency is deviated in a direction of being lowered, power transmission is stopped regardless of the extent of deviation of the resonance frequency.

On the other hand, in a case where the estimated value (the difference between the amount of transmission power and the amount of reception power) of the amount of power absorbed by the foreign substance is smaller than the predetermined threshold value, it is determined that a foreign substance influencing wireless power transmission is not present in the power transmission region (determination of OK), and power transmission is continued.

Consequently, it is possible to determine whether or not a foreign substance influencing wireless power transmission is present with higher accuracy, and thus this further contributes to improving reliability of the wireless power feeding system.

Fourth Embodiment

A fourth embodiment exemplifies another method until power transmission is started in a normal amount of power in the process flow of the power transmission control in the wireless power feeding system according to the first embodiment. In addition, remaining control and a configuration of a wireless power feeding system related thereto are the same as those in the first embodiment, and detailed description thereof will be omitted.

Figure 17:
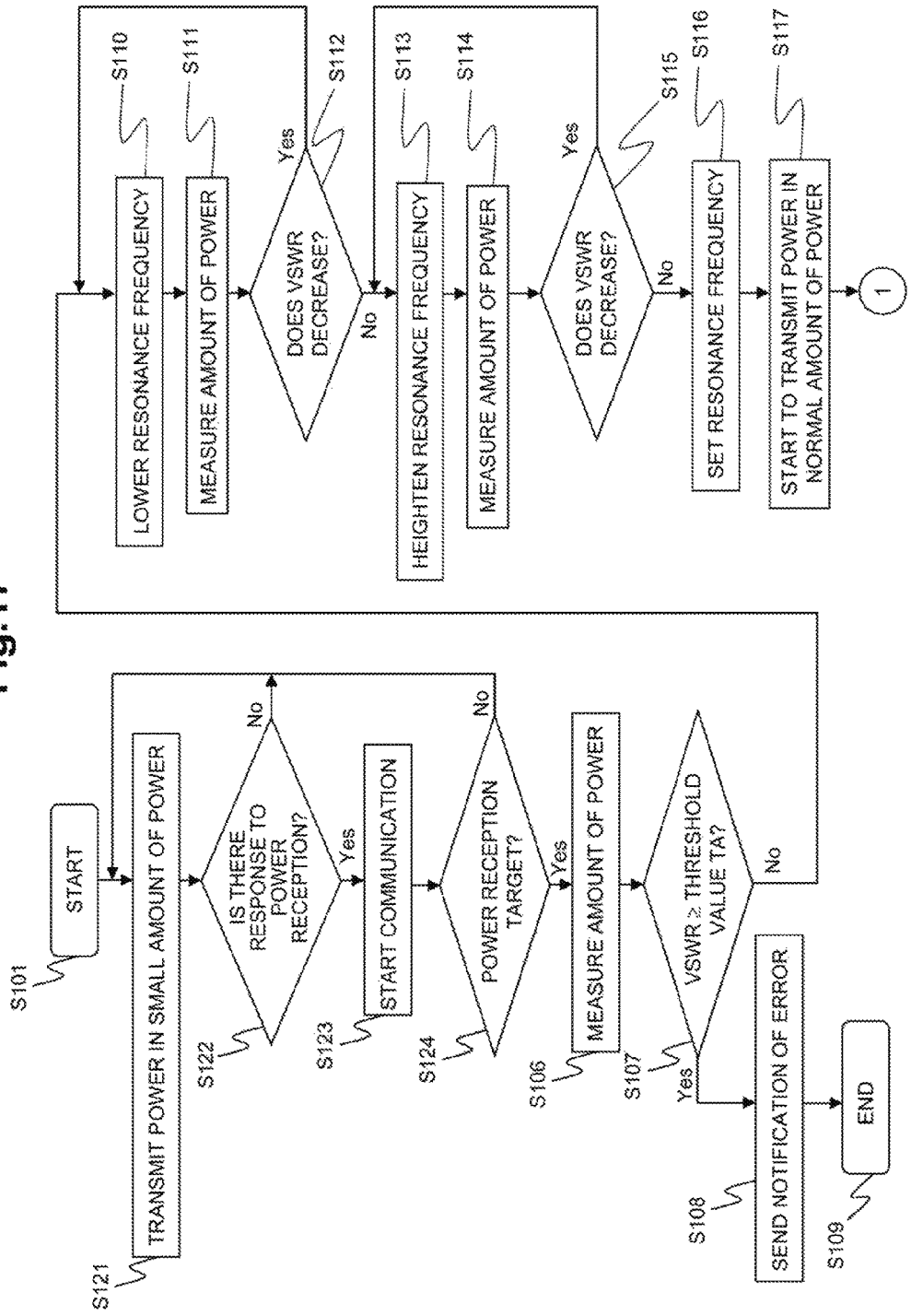
FIG. 17 is a flowchart illustrating an example of a flow of processes until power transmission is started in a wireless power feeding system according to a fourth embodiment.

FIG. 17 is a flowchart illustrating an example of a flow of processes until power transmission is started in a wireless power feeding system according to the fourth embodiment. The flowchart of FIG. 17 exemplifies a flow of processes, for example, until power is transmitted after it is detected that the power reception device 2 is present in a power transmission region of the power transmission device 1.

For example, if the power transmission device 1 is powered on, and thus the power transmission device 1 enters an operable state, processes related to the power transmission control are started (step S101). First, the power transmission device 1 starts to transmit power in an amount of power lower than at normal times (step S121). Specifically, the control circuit 104 changes an amplification factor of the power transmission amplifier 102 so that an amount of power lower than an amount of power during normal power transmission is obtained. Consequently, even in a case where the foreign substance is present in the power transmission region of the power transmission device 1 from the beginning, an influence on the foreign substance can be reduced.

If the power transmission is started in step S121, the power transmission device 1 waits for a response to power reception from the power reception device 2 (step S122). For example, if the power transmitted in step S121 is received, the power reception device 2 transmits information regarding an amount of reception power to the power transmission device 1. In a case where the information regarding the amount of reception power is not received, the power transmission device 1 continues to transmit power in a small amount of power until the information is received (steps S121 and S122).

In a case where the information regarding the amount of reception power is received, the power transmission device 1 determines that there is a response to the power reception, and transmits data from the antenna 111 so as to perform wireless communication with the power reception device 2 (step S123). The power transmission device 1 performs authentication of whether or not the power reception device which has transmitted the information regarding the received power is a power transmission target (step S124). As a result of the authentication, if it is determined that the power reception device is not a power transmission target of the power transmission device 1, the flow returns to step S121, and the power transmission device 1 continues to transmit power in a small amount of power. As a result of the authentication, if it is determined that the power reception device is a power transmission target of the power transmission device 1, the power transmission device 1 measures the voltage Vi corresponding to an incident power amount and the voltage Vr corresponding to a reflected power amount so as to calculate the voltage standing wave ratio VSWR by using the control circuit 104 (step S106). The subsequent processes are the same as in FIG. 13.

Generally, since a power transmission distance using wireless power transmission is longer than a communication distance using wireless communication, there may be a situation in which the wireless communication can be performed between the power transmission device and the power reception device, but sufficient power cannot be transmitted and received. For example, even if the power reception device is authenticated as a power transmission target through the wireless communication between the power transmission device and the power reception device, and then power starts to be transmitted from the power transmission device, there is a possibility that the power reception device cannot receive sufficient power from the power transmission device. According to the process flow according to the present embodiment, since wireless power transmission is first performed, and it is determined whether or not a process for power transmission is continued on the basis of the presence or absence of a response to power reception, it is possible to prevent power transmission from being started in such a situation in which the power reception device cannot receive sufficient power. Consequently, it is possible to further increase reliability of power transmission control in the wireless power transmission system.

Fifth Embodiment

Figure 18:
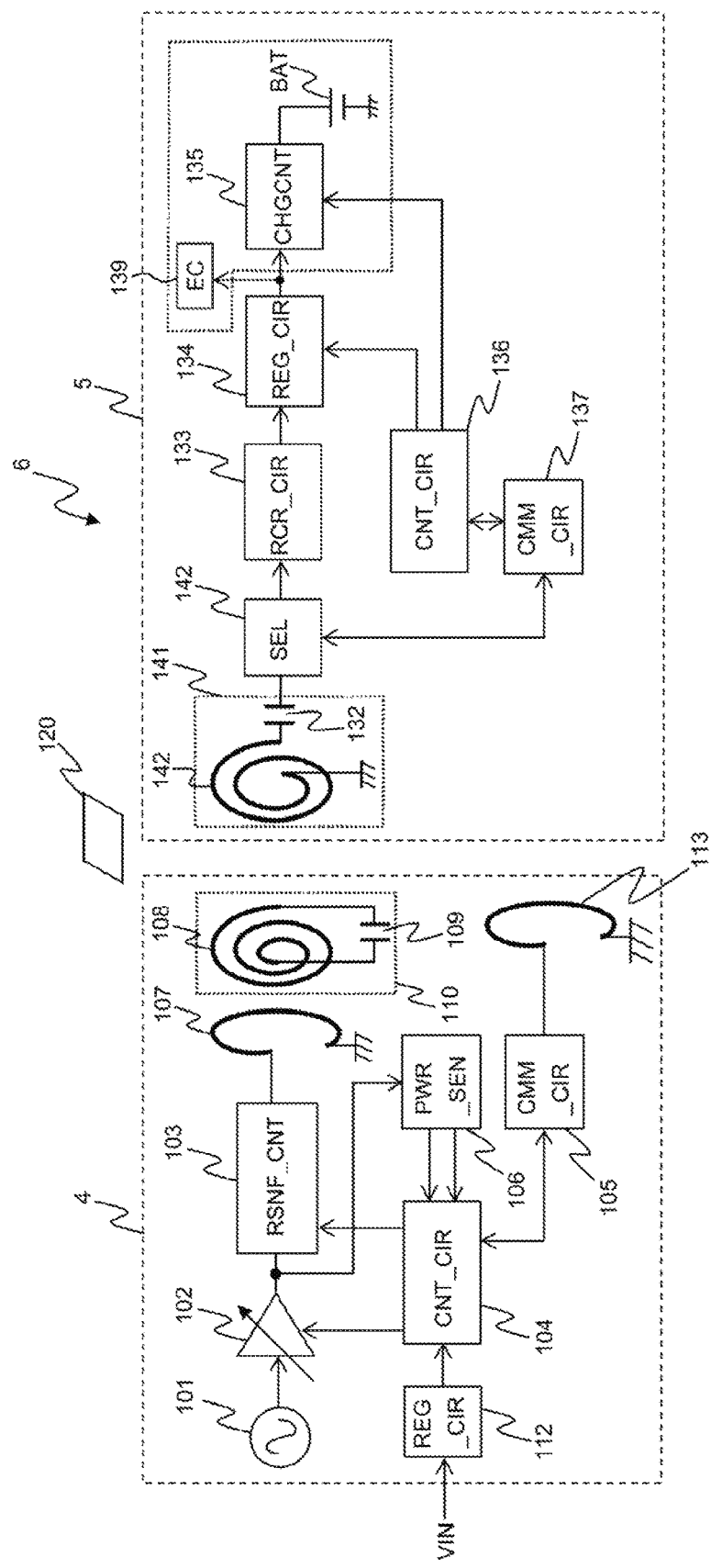
FIG. 18 is a diagram exemplifying a wireless power feeding system including a power transmission device according to a fifth embodiment.

FIG. 18 is a diagram exemplifying a wireless power feeding system including a power transmission device according to a fifth embodiment.

In FIG. 18, a wireless power feeding system 6 includes a power transmission device 4 and a power reception device 5. In the wireless power feeding system 6, wireless power transmission based on a magnetic resonance method can be performed from the power transmission device 4 to the power reception device 5, and NFC communication can be performed between the power transmission device 4 and the power reception device 5.

The power transmission device 4 includes a coil antenna 113 instead of the antenna 110, and the communication unit 105 can perform the NFC communication via the coil antenna 113. Remaining configurations are the same as those of the power transmission device 1.

The power reception device 5 shares an antenna used for the NFC communication and an antenna used for power feeding based on the magnetic resonance method, and can perform switching between transmission/reception of power and communication for transmitting information. Therefore, it is possible to miniaturize the power reception device 5.

Specifically, the power reception device 5 includes a resonance circuit 140 constituted of a power reception coil 141 and a resonance capacitor 132, and a switching circuit (SEL) 142 connected to the resonance circuit 140. Remaining configurations are the same as those of the power reception device 2.

The switching circuit 142 selects one of the communication unit 137 and the rectifying circuit 133 depending on a signal level of an AC signal received by the resonance circuit 140, and outputs the signal to the selected one.

For example, in a case where NFC communication is performed between the power transmission device 4 and the power reception device 5, in the power transmission device 4, the communication unit 105 enters an ON state (an enable state), the power transmission amplifier 102 enters an OFF state (a disable state), and thus the NFC communication is performed by the coil antenna 113. In contrast, in the power reception device 5, an output terminal of the switching circuit 142 is set on the communication unit 137 side at normal times, and thus the NFC communication is started when the power reception device 5 becomes close to a communicable region of the power transmission device 4. If the power reception device 5 is authenticated as a power transmission target of the power transmission device 4 through the NFC communication, the power transmission device 4 causes the communication unit 105 to enter an OFF state and the power transmission amplifier 102 to enter an ON state, so as to start power transmission. If the power reception device 5 receives a signal with a level higher than during the NFC communication, the output terminal of the switching circuit 142 is switched to the rectifying circuit 133 side. Consequently, power is received.

Control other than the above-described control is the same as in the wireless power feeding system 3. In other words, if control for stopping power transmission is performed when the NFC communication (wireless communication) is performed, the same control as in the process flow (FIGS. 13 and 14) in the wireless power feeding system 3 can be performed.

Therefore, in the wireless power feeding system 6 according to the fifth embodiment, it is possible to increase reliability of power transmission control in the same manner as in the wireless power feeding systems according to the first to fourth embodiments.

Sixth Embodiment

Figure 19:
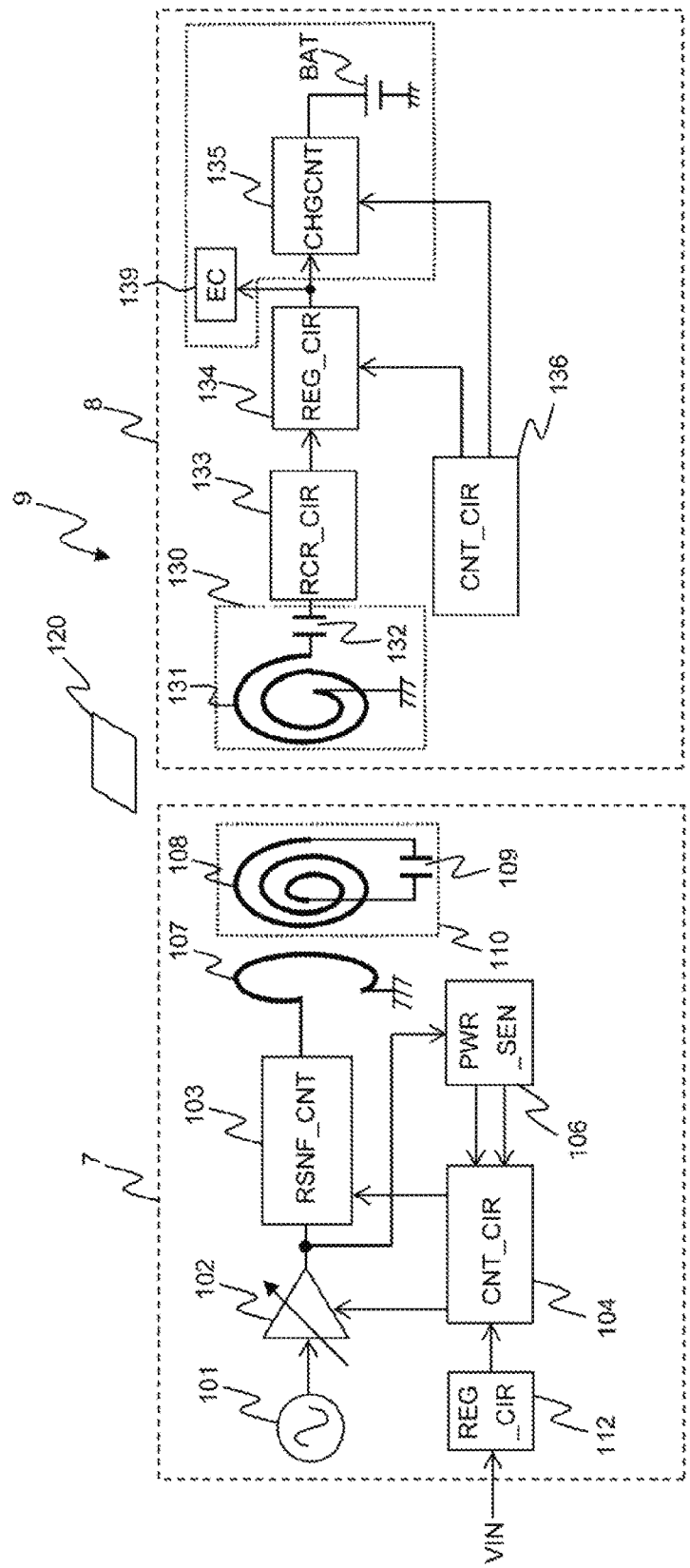
FIG. 19 is a diagram exemplifying a wireless power feeding system including a power transmission device according to a sixth embodiment.

FIG. 19 exemplifies a wireless power feeding system including a power transmission device according to a sixth embodiment.

In FIG. 19, a wireless power feeding system 9 includes a power transmission device 7 and a power reception device 8. In the wireless power feeding system 9, wireless power transmission based on a magnetic resonance method can be performed from the power transmission device 7 to the power reception device 8, and wireless communication is not performed between the power transmission device 7 and the power reception device 8. Specifically, the power transmission device 7 has a configuration in which the communication unit 105 and the communication antenna 111 are omitted from the power transmission device 1, and the power reception device 8 has a configuration in which the communication unit 137 and the communication antenna 138 are omitted from the power reception device 2. Remaining configurations are the same as in the wireless power feeding system 3.

Figure 20:
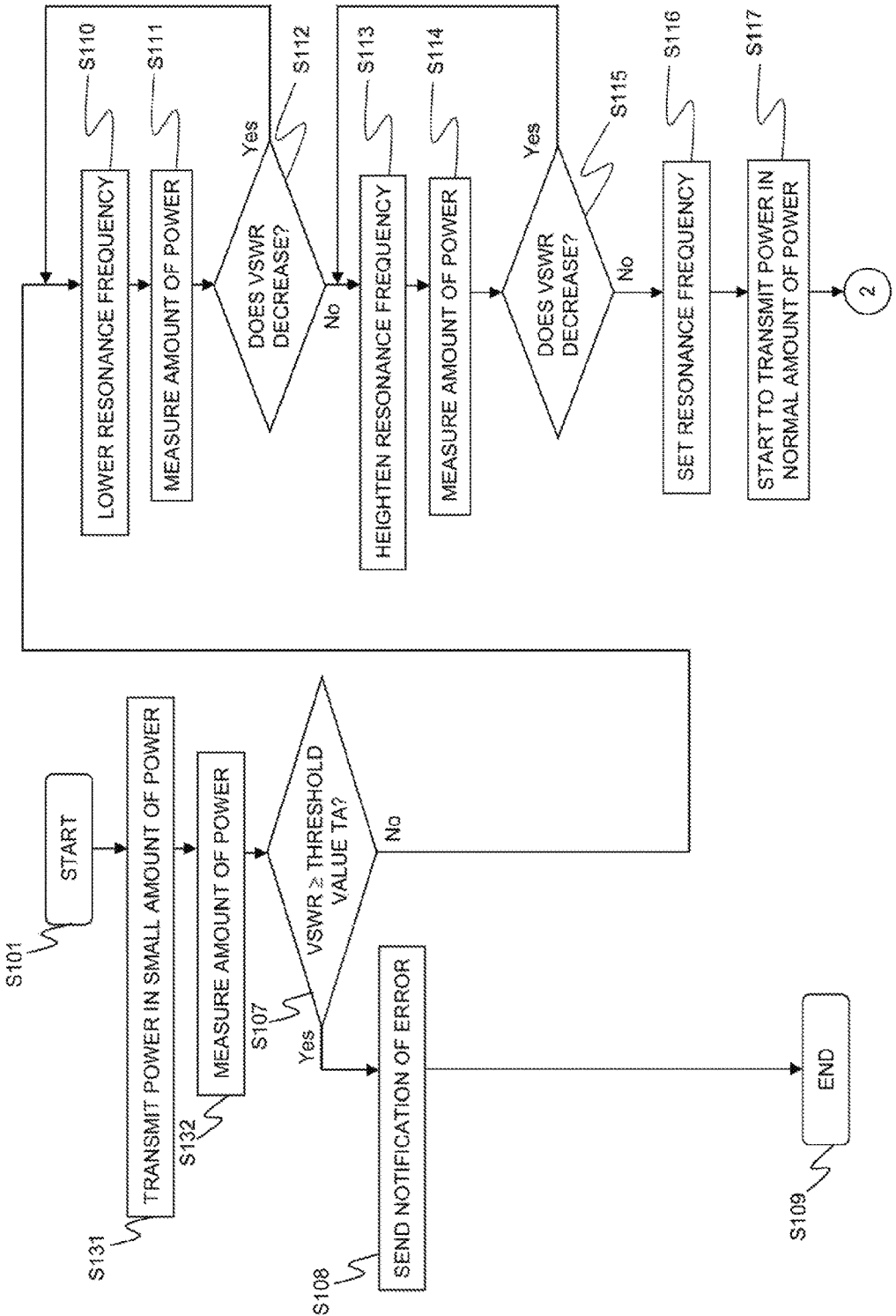
FIG. 20 is a flowchart illustrating an example of a flow of processes until power transmission is started in a wireless power feeding system 9 according to the sixth embodiment.

With reference to FIGS. 20 and 21, a detailed description will be made of a power transmission control process in the wireless power feeding system 9.

FIG. 20 is a flowchart illustrating an example of a flow of processes until power transmission is started in the wireless power feeding system 9. The flowchart of FIG. 20 exemplifies a flow of processes, for example, until power transmission is started in a normal amount of power after the power transmission device 7 is powered on.

For example, if the power transmission device 7 is powered on, and thus the power transmission device 7 enters an operable state, processes related to the power transmission control are started (step S101). First, the power transmission device 7 starts to transmit power in an amount of power lower than at normal times (step S131). Specifically, the control circuit 104 changes an amplification factor of the power transmission amplifier 102 so that an amount of power lower than an amount of power during normal power transmission is obtained. Consequently, even in a case where the foreign substance is present in the power transmission region of the power transmission device 7 from the beginning, an influence on the foreign substance can be reduced. The power transmission device 7 measures the voltage Vi corresponding to an incident power amount and the voltage Vr corresponding to a reflected power amount in a period in which power is transmitted in the amount of power lower than during the normal power transmission, and calculates the voltage standing wave ratio VSWR by using the control circuit 104 (step S107). The subsequent processes are the same as in FIG. 13.

According to the above-described process, even if wireless communication is not performed, in the same manner as in the wireless power feeding system 3 according to the first embodiment, it is possible to search for a resonance frequency which causes a reflected power amount to become smallest and to set the resonance frequency in the resonance circuit 110 of the power transmission side, and thus to easily realize wireless power transmission with high efficiency. In addition, power transmission is first started in a small amount of power, and then power transmission is started in an increasing amount of power. Thus, it is possible to increase reliability of power transmission control in the wireless power transmission system.

FIG. 21 is a flowchart illustrating an example of a flow of processes in a case where a foreign substance becomes close to the wireless power feeding system 9. The flowchart of FIG. 21 exemplifies a flow of processes, for example, in a case where a foreign substance becomes close after the power transmission device 7 starts power transmission in a normal amount of power.

The process flow illustrated in FIG. 21 is the same as the process flow (FIG. 14) related to the first embodiment except that wireless communication is not performed between the power reception device 8 and the power transmission device 7.

For example, if power transmission is started in a normal amount of power in step S117 of FIG. 20, the power transmission device 1 measures the voltage Vi corresponding to an incident power amount and the voltage Vr corresponding to a reflected power amount so as to calculate the voltage standing wave ratio VSWR by using the control circuit 104 (step S202). The subsequent processes are the same as in FIG. 14.

Consequently, even if wireless communication is not performed, in the same manner as in the wireless power feeding system 3 according to the first embodiment, it is possible to determine not only whether or not a foreign substance is present in a power transmission region of the wireless power feeding system but also whether or not the foreign substance is a foreign substance influencing wireless power transmission with high accuracy, and thus to improve reliability of the wireless power feeding system. Particularly, the power transmission device 7 is appropriately applied to a wireless power feeding system for use only in a small-sized electrical device. For example, in a case where a power reception device is a small-sized electrical device such as an electrical shaver, the electrical shaver does not require high transmission power, and thus it is possible to determine whether or not the electrical shaver is a foreign substance influencing wireless power transmission even if wireless communication is not performed.

As mentioned above, the invention made by the inventor has been described in detail on the basis of the embodiments, but the invention is not limited thereto, and may be variously modified within the scope without departing from the spirit thereof.

For example, in the foreign substance determination process according to the second embodiment, in a case where a resonance frequency is deviated in a direction of being lowered, an example has been described in which control for stopping power transmission is performed regardless of the extent of deviation of the resonance frequency, but the control is not limited thereto, and the control may be changed depending on the extent of deviation of the resonance frequency even in a case where the resonance frequency is deviated in a direction of being lowered. For example, in a case where the resonance frequency is deviated in a direction of being lowered, and the extent of deviation thereof is slight, it is determined that a foreign substance (an IC card or the like) influences wireless power transmission (determination of NG), and power transmission is stopped. On the other hand, in a case where the resonance frequency is deviated in a direction of being lowered, and the extent of deviation thereof is considerable, it is determined that a foreign substance (a human body or the like) does not influence wireless power transmission (determination of OK), and power transmission may be continued. Consequently, it is possible to perform more efficient power transmission on the major premise that an electromagnetic wave generated from the wireless power feeding system does not exert an adverse effect on the human body.

In addition, in the third embodiment, a case has been exemplified in which the foreign substance determination process is performed on the basis of an estimated value of an amount of power absorbed by a foreign substance, a deviation direction of a resonance frequency, and the extent of deviation of the resonance frequency, but the embodiment is not limited thereto. For example, the foreign substance determination process may be performed on the basis of an estimated value of an amount of power absorbed by a foreign substance, and a deviation direction of a resonance frequency.

The power transmission device 4 according to the fifth embodiment may perform the foreign substance determination process (step S211) on the basis of not only a deviation direction of a resonance frequency but also the extent of deviation of the resonance frequency or an estimated value of an amount of power absorbed by a foreign substance in the same manner as in the second and third embodiments.

The power transmission device 7 according to the sixth embodiment may perform the foreign substance determination process (step S211) on the basis of not only a deviation direction of a resonance frequency but also the extent of deviation of the resonance frequency in the same manner as in the second embodiment.

In the first to sixth embodiments, a case where the power reception device 2 or the like is a small-sized portable device such as a portable terminal has been exemplified, but a power reception device is not particularly limited as long as the device can perform power feeding in a wireless manner. For example, a power reception device may be a notebook PC or a vehicle.

As a method of deriving a resonance frequency which causes a value of VSWR (reflected power amount) to become smallest, the processes in steps S110 to S115 of FIG. 13 and steps S205 to S210 of FIG. 14 have been exemplified, but the method is not limited thereto. A resonance frequency which causes a value of VSWR (reflected power amount) to become smallest may be derived through, for example, binary search.

As a configuration for adjusting impedance of the resonance frequency adjustment circuit 103, the configuration in which the capacitors 201 and 203 are variable has been exemplified, but the configuration is not limited thereto, and the inductor 202 may be configured to be variable.

INDUSTRIAL APPLICABILITY

The invention may be widely applied to a power transmission device and a wireless power feeding system using magnetic resonance.

EXPLANATION OF REFERENCE NUMERALS

1 Power transmission device
2 Power reception device
3 Wireless power feeding system
101 Oscillator
102 Power transmission amplifier
103 Resonance frequency adjustment circuit
104 Control circuit
105 Communication unit
106 Power amount detection unit
107 Power feeding coil
108 Resonance coil
109 Resonance capacitor
110 Resonance circuit
111 Communication antenna
112 Power source circuit
Vi Voltage corresponding to incident power amount of driving signal supplied from power transmission amplifier 102 to resonance circuit 110 side
Vr Voltage corresponding to reflected power amount of driving signal
130 Resonance circuit
131 Power reception coil 132 Resonance capacitor
133 Rectifying circuit
134 Power source circuit
135 Charging control circuit
136 Control circuit
137 Communication unit
138 Communication antenna
139 Internal circuit
140 Load circuit
BAT Battery
202 Inductor
201 and 203 Variable capacitor
10 Impedance of power feeding coil 107 side in a case where resonance frequency adjustment circuit 103 is not provided
A, B, and C Movement direction of impedance
11 Impedance when matching occurs
300 and 301 Reflection characteristic
503 and 504 Variable capacitance diode
501 and 502 Capacitor
505 and 506 Resistor
601, 602, 601_1 to 601_n, and 602_1 to 602_m Capacitive circuit
603 Capacitor
SW Switch circuit
606 and 607 Resistor
604 and 605 Field effect transistor
701 Troidal core
702 Primary coil
703 Secondary coil
704, 705, 707, and 709 Capacitor
706 and 707 Detection diode
710 Reflected power reference resistor
711 Input power reference resistor
712 and 713 Resistor
714 Reflected voltage output terminal
715 Reflected voltage output terminal
ND1 and ND2 Node
731 Troidal core
732 Troidal core
735 and 736 Primary coil
737 and 738 Secondary coil
733 and 734 Detection circuit
12 Position of impedance when resonance frequency matches power transmission frequency
13 Position of impedance when resonance frequency is deviated to higher side
14 Position of impedance when resonance frequency is deviated to lower side
400, 401, and 402 Reflection characteristic
4 and 7 Power transmission device
5 and 8 Power reception device
6 and 9 Wireless power feeding system
142 Switching circuit

What is claimed is:

1. A power transmission device which performs a power transmission process for transmitting power in a wireless manner through electromagnetic field resonance coupling using a resonance circuit,
wherein, in a case where a resonance frequency of the resonance circuit set to be the same as a frequency of a power transmission signal which is output as transmission power is deviated during transmission of the power, the power transmission device detects a direction in which the resonance frequency is deviated and controls the power transmission process on the basis of a detection result thereof, and
wherein the power transmission device further determines whether the resonance frequency is deviated by a presence of a non-metallic object.

2. The power transmission device according to claim 1, wherein whether or not transmission of the power is continued is controlled on the basis of the detection result.

3. The power transmission device according to claim 2, wherein the power transmission device detects the extent of deviation of the resonance frequency in addition to the direction in which the resonance frequency is deviated.

4. The power transmission device according to claim 1, wherein the power transmission device controls the power transmission process on the basis of a difference between an amount of reception power which is received by an external device as a power transmission target, and an amount of the transmission power which is transmitted in addition to the detection result.

5. The power transmission device according to claim 2, wherein transmission of the power is continued in a case where the resonance frequency is deviated in a direction of being heightened, and transmission of the power is stopped in a case where the resonance frequency is deviated in a direction of being lowered.

6. The power transmission device according to claim 3, wherein, in a case where the resonance frequency is deviated in a direction of being heightened, transmission of the power is stopped if the extent of deviation of the resonance frequency exceeds a predetermined threshold value, and transmission of the power is continued if the extent of deviation of the resonance frequency does not exceed the predetermined threshold value, and in a case where the resonance frequency is deviated in a direction of being lowered, transmission of the power is stopped.

7. The power transmission device according to claim 1, comprising:
a power source unit that generates an AC signal corresponding to the transmission power;
a primary side resonance circuit that includes a primary side resonance coil and a resonance capacitor as a power transmission antenna, and is supplied with power based on the AC signal generated by the power source unit;
a resonance frequency adjustment unit that is provided between the power source unit and the primary side resonance circuit, and adjusts a resonance frequency of the primary side resonance circuit;
a power amount detection unit that detects the magnitude of a reflected power amount of an AC signal which is supplied to the primary side resonance circuit from the power source unit; and
a control unit,
wherein the control unit changes the resonance frequency of the primary side resonance circuit by controlling the resonance frequency adjustment unit, and determines a direction in which the resonance frequency is deviated by determining a direction in which the reflected power amount detected by the power amount detection unit is changed.

8. The power transmission device according to claim 7, wherein the control unit controls the resonance frequency adjustment unit so that the resonance frequency of the primary side resonance circuit is heightened, determines that the resonance frequency is deviated in a direction in which the resonance frequency becomes higher than the frequency of the power transmission signal in a case where the reflected power amount increases, and determines that the resonance frequency is deviated in a direction in which the resonance frequency becomes lower than the frequency of the power transmission signal in a case where the reflected power amount decreases.

9. The power transmission device according to claim 7, wherein the control unit controls the resonance frequency adjustment unit so that the resonance frequency of the primary side resonance circuit is lowered, determines that the resonance frequency is deviated in a direction in which the resonance frequency becomes lower than the frequency of the power transmission signal in a case where the reflected power amount increases, and determines that the resonance frequency is deviated in a direction in which the resonance frequency becomes higher than the frequency of the power transmission signal in a case where the reflected power amount decreases.

10. The power transmission device according to claim 7, wherein the control unit determines a deviation direction of the resonance frequency on the basis of a change direction of the reflected power amount when adjusting the resonance frequency adjustment unit so that the resonance frequency of the primary side resonance circuit is lowered, and a change direction of the reflected power amount when adjusting the resonance frequency adjustment unit so that the resonance frequency of the primary side resonance circuit is heightened.

11. The power transmission device according to claim 7, wherein the power amount detection unit generates a voltage corresponding to an incident power amount of an AC signal which is supplied from the power source unit to the primary resonance circuit side and a voltage corresponding to a reflected power amount of the AC signal, and
wherein the control unit calculates a voltage standing wave ratio on the basis of the voltage corresponding to the incident power amount and the voltage corresponding to the reflected power amount, generated by the power amount detection unit, and determines a change direction of the reflected power amount on the basis of a calculation result thereof.

12. The power transmission device according to claim 11, wherein the control unit performs a calculation process of controlling the resonance frequency adjustment unit so as to change the resonance frequency of the primary side resonance circuit in one direction for each unit adjustment amount, thereby sequentially calculating values of the voltage standing wave ratio and also sequentially comparing calculated values before and after the resonance frequency is changed, performs the calculation process by reversing a direction in which the resonance frequency is changed if a calculated value after the resonance frequency is changed is greater than a calculated value before the resonance frequency is changed, and stops the calculation process if a calculated value after the resonance frequency is changed is smaller than a calculated value before the resonance frequency is changed.

13. The power transmission device according to claim 7, further comprising:
a communication antenna; and
a communication unit that controls transmission and reception of data using the communication antenna.

14. A wireless power feeding system comprising:
the power transmission device according to claim 1; and
a power reception device that receives power supplied from the power transmission device in a wireless manner through electromagnetic field resonance coupling using a resonance circuit.

15. The wireless power feeding system according to claim 14,
wherein the power transmission device and the power reception device can perform data communication conforming to an NFC standard, and
wherein the power reception device can perform the data communication and power reception by using a single antenna.

16. A control method for controlling power transmission in a wireless power feeding system which includes a power transmission device and a power reception device and performs transmission and reception of power through electromagnetic field resonance coupling using power transmission side and power reception side resonance circuits which are respectively provided in the power transmission device and the power reception device, the method comprising:
performing by the power transmission device:
setting a resonance frequency of the power transmission side resonance circuit so that the resonance frequency is the same as a frequency of a power transmission signal which is output as transmission power;
starting transmission of the power after setting the resonance frequency; and
detecting a direction in which the resonance frequency is deviated in a case where the resonance frequency, after being set, is deviated during transmission of the power and to control a process related to transmission of the power on the basis of a detection result thereof;
and determining whether the resonance frequency is deviated by a presence of a non-metallic object.

17. The control method according to claim 16,
further comprising:
measuring a reflected power amount of an AC signal supplied to the resonance circuit while changing the resonance frequency of the power transmission side resonance circuit, thereby estimating a resonance frequency which causes the reflected power amount to be smallest, and generating information regarding deviation of the resonance frequency, including a deviation direction of the resonance frequency on the basis of the estimated resonance frequency;
determining the presence or absence of a foreign substance influencing wireless power transmission on the basis of the information regarding deviation of the resonance frequency; and
stopping transmission of the power in a case where it is determined that there is a foreign substance influencing the wireless power transmission, and to continue transmission of the power in a case where there is no foreign substance influencing the wireless power transmission.

18. The control method according to claim 17,
wherein the information regarding deviation includes the extent of deviation of the resonance frequency in addition to a deviation direction of the resonance frequency.

19. The control method according to claim 17, further comprising:

receiving information, regarding an amount of reception power which is received, at the power transmission device, and calculating a difference between the amount of reception power and an amount of transmission power which is transmitted from the power transmission device on the basis of the information regarding the reception power, transmitted from the power reception device, and determining the presence or absence of a foreign substance influencing wireless power transmission on the basis of the difference and the deviation information.

20. The control method according to claim 17, further comprising:

determining that there is a foreign substance which does not influence wireless power transmission in a case where the resonance frequency is deviated in a direction of being heightened, and determining that there is a foreign substance which influences wireless power transmission in a case where the resonance frequency is deviated in a direction of being lowered.

\* \* \* \* \*